United States Patent [19]

Holonyak, Jr. et al.

[11] Patent Number: 5,353,295

[45] Date of Patent: Oct. 4, 1994

[54] SEMICONDUCTOR LASER DEVICE WITH COUPLED CAVITIES

[75] Inventors: Nick Holonyak, Jr., Urbana; Nada El-Zein, Champaign, both of Ill.; Fred A. Kish, Sunnyvale, Calif.

[73] Assignee: The Board of Trustees of the University of Illinois, Urbana, Ill.

[21] Appl. No.: 927,822

[22] Filed: Aug. 10, 1992

[51] Int. Cl.$^5$ ............................................. H01S 3/19
[52] U.S. Cl. ........................................ 372/50; 372/46; 372/97
[58] Field of Search ..................... 372/44, 45, 46, 50, 372/92, 97

[56] References Cited

U.S. PATENT DOCUMENTS

| | | | |
|---|---|---|---|
| 4,172,906 | 10/1979 | Pancholy | 427/82 |
| 4,176,206 | 11/1979 | Inoue | 427/82 |
| 4,291,327 | 9/1981 | Tsang | 357/52 |
| 4,369,513 | 1/1983 | Umeda et al. | 372/46 |
| 4,378,255 | 3/1983 | Holonyak, Jr. et al. | 148/1.5 |
| 4,461,007 | 7/1984 | Burnham et al. | 372/45 |
| 4,511,408 | 4/1985 | Holonyak, Jr. | 148/1.5 |
| 4,639,275 | 1/1987 | Holonyak, Jr. | 148/1.5 |
| 4,674,096 | 6/1987 | Salzman et al. | 372/50 |
| 4,740,978 | 4/1988 | Göbel et al. | 372/50 |
| 4,817,103 | 3/1989 | Holonyak, Jr. et al. | 372/45 |

FOREIGN PATENT DOCUMENTS 642318 1/1989 Japan.

OTHER PUBLICATIONS

J. M. Dallesasse, N. Holonyak, Jr., A. R. Sugg, T. A. Richard, & N. El-Zein, "Hydrolization Oxidation of $Al_xGa_{1-x}As$-AlAs-GaAs Quantum Well Heterostructures And Superlattices", Appl. Phys. Lett. 57, 2844, Dec. 24, 1990.

J. M. Dallesasse & N. Holonyak, Jr., "Native-Oxide Stripe-Geometry $Al_xGa_{1-x}As$-GaAs Quantum Well Heterostructure Lasers", Appl. Phys. Lett. 58, 394, Jan. 28, 1991.

J. M. Dallesasse, N. Holonyak, Jr., D. C. Hall, N. El-Zein A. R. Sugg, S. C. Smith, & R. D. Burnham, "Native-Oxide-Defined Coupled-Stripe $Al_xGa_{1-x}As$-GaAs Quantum Well Heterostructures Lasers", Appl. Phys. Lett. 58, 834, Feb. 25, 1991.

A. R. Sugg, N. Holonyak, Jr., J. E. Baker, F. A. Kish, & J. M. Dallesasse, "Native Oxide Stabilization of AlAs-GaAs Heterostructures", Appl. Phys. Lett. 58, 1199, Mar. 18, 1991.

(List continued on next page.)

Primary Examiner—James W. Davie
Attorney, Agent, or Firm—Martin M. Novack

[57] ABSTRACT

In a form of the disclosure an array of coupled cavities (called minicavities) of a QWH semiconductor laser are defined by a native oxide of an aluminum-bearing III-V semiconductor material and are arranged serially end-to-end along the longitudinal direction. The native oxide confines the injected carriers and optical field within the cavities, resulting in reflection and optical feedback distributed periodically along the laser stripe. Single-longitudinal-mode operation is exhibited over an extended range. In a further form of the disclosure, two linear arrays of end-coupled minicavities are arranged side by side to obtain a two dimensional array, with resultant lateral coupling between the linear arrays. The two dimensional array exhibits mode switching and multiple switching in the light power (L) versus current (I) characteristic (L-I) with increasing current. In another form of the disclosure, a stripe laser is transversely coupled (or side-coupled) with a linear array of end-coupled minicavities. Bistability and switching are demonstrated in the light versus current (L-I) characteristic of a native-oxide-defined structure of this type. The device, with internally coupled elements and the current partitioned among the elements, exhibits a large hysteresis in the L-I curve, with switching from the stimulated to the spontaneous regime occurring over substantial power (light) and current ranges.

34 Claims, 15 Drawing Sheets

OTHER PUBLICATIONS

F. A. Kish, S. J. Caracci, N. Holonyak Jr., J. M. Dallesasse, A. R. Sugg, R. M. Fletcher, C. P. Kuo, T. D. Osentowski, & M. G. Craford, "Native-Oxide Stripe–Geometry $IN_{0.5}(Al_xGa_{1-x})_{0.5}P-In_{0.5}Ga_{0.5}P$ Heterostructure Laser Diodes", Appl. Phys. Lett. 59, 354, Jul. 15, 1991.

N. El-Zein, N. Holonyak, Jr., F. A. Kish, A. R. Sugg, T. A. Richard, J. M. Dallesasse, S. C. Smith, & R. D. Burnham, "Native-Oxide-Masked Si Impurity-Induced Layer Disordering of $Al_xGa_{1-x}As-Al_yGa_{1-y}As-Al_zGa_{1-z}As$ Quantum-Well Heterostructures", J. Appl. Phys. 70, 2031, Aug. 15, 1991.

F. A. Kish, S. J. Caracci, N. Holonyak, Jr., J. M. Dallesasse, K. C. Hsieh, M. J. Ries, S. C. Smith, & R. D. Burnham, "Planar Native-Oxide Index-Guided $Al_xGa_{1-x}GaAs$ Quantum Well Heterostructure Lasers", Appl. Phys. Lett. 59, 1755, Sep. 30, 1991.

N. El-Zein, F. A. Kish, N. Holonyak, Jr., A. R. Sugg, M. J. Ries, S. C. Smith, J. M. Dalessase, and R. D. Burnham, "Native-Oxide Coupled-Cavity $Al_xGa_{1-x}As-GaAs$ Quantum Well Heterostructure Laser Diodes", Appl. Phys. Lett. 59, 2838, Nov. 25, 1991.

F. A. Kish, S. J. Caracci, N. Holonyak, Jr., and S. A. Maranowski, J. M. Dallesasse, R. D. Burnham, and S. C. Smith, "Visible Spectrum Native-Oxide Coupled-Stripe $In_{0.5}(Al_xGa_{1-x})_{0.5}P-In_{0.5}P$ Quantum Well Heterostructure Laser Arrays", Appl. Phys. Lett. 59 2883, Nov. 25, 1991.

F. A. Kish, S. J. Caracci, N. Holonyak, Jr., P. Gavrilovic, K. Meehan, & J. E. Williams, "Coupled-Stripe In-Phase Operation of Planar Native-Oxide Index–Guided $Al_yGa_{1-y}As-GaAs-In_xGa_{1-x}As$ Quantum-Well Heterostructure Laser Arrays", Appl. Phys. Lett. 60, 71, Jan. 6, 1992.

F. A. Kish, S. J. Caracci, S. A. Maranowski, N. Holonyak, Jr., K. C. Hsieh, C. P. Kuo, R. M. Fletcher, T. D. Osentowski, & M. G. Craford, "Planar Native-Oxide Buried-Mesa $Al_xGa_{1-x}As-In_{0.5}(Al_yGa_{1-y})_{0.5}P-In_{0.5}(Al_zGa_{1-z})_{0.5}P$ Visible-Spectrum Laser Diodes", J. Appl. Phys. 71, 2521, Mar. 15, 1992.

M. J. Ludowise, "Metalorganic Chemical Vapor Deposition of III-V Semiconductors", J. Appl. Phys., 58, R31 1985.

G. E. Smith, "Phase Matching In Four-Layer Optical Waveguides", IEEE J. Quantum Electron., QE-4, 288 (1968).

E. Marcatelli, "Bends In Optical Dielectric Guides", Bell Syst. Tech. J. 48, 2103, 1969.

P. Sansonetti et al., "Low-Threshold GaAs/GaAlAs Buried Heterostructure Laser With An Ion-Beam Etched Laser With An Ion-Beam-Etched Quarter Ring Cavity", Electron Lett. 23, 485 (1987).

J. Butler et al., "Coupled-Mode Analysis of Phase-Locked Injection Laser Arrays", Appl. Phys. Lett., 44, 293, 1984.

L. J. Guido, W. E. Plano, G. S. Jackson, N. Holonyak, Jr., R. D. Burnham, & J. E. Epler, "Coupled-Stripe $Al_xGa_{1-x}As-GaAs$ Quantum Well Lasers Defined By Vacancy-Enhanced Impurity-Induced Layer Disordering From $(Si_2)_y$ $(GaAs)_{1-y}$ Barriers", Appl. Phys. Lett. 50, 757 (1987).

J. S. Major, Jr., D. C. Hall, L. J. Guido, N. Holonyak, Jr., P. Gavrilovic, K. Meehan, J. E. Williams, & W. Stutius, "High-Power Disorder-Defined Coupled Stripe $Al_yGa_{1-y}As-GaAs-In_xGa_{1-x}As$ Quantum Well Heterostructure Lasers", Appl. Phys. Lett. 55, 271 (1989).

J. Carran et al., "GaAs Lasers Utilizing Light Propagation Along Curved Junctions", IEEE J. Quantum Electron. QE-6 367 (1970).

A. S. H. Liao et al., "Semiconductor Injection Lasers With a Circular Resonator", Appl. Phys. Lett. 36, 801 (1980).

D. G. Deppe, G. S. Jackson, N. Holonyak, Jr., R. D. Burnham, & R. L. Thorton, "Coupled Stripe $Al_xGa_{1-x}As-GaAs$ Quantum Well Lasers Defined By Impurity-Induced (Si) Layer Disordering", Appl. Phys. Lett. 50, 632 (1987).

R. D. Dupuis et al., Proceedings of the International Symposium on GaAs and Related Compounds, "Preparation And Properties of $Ga_{1-x}Al_xAs-GaAs$ Heterojunctions Grown By Metallorganic Chemical Vapour Deposition", pp. 1–9, Inst. of Physics, London, 1979.

F. A. Kish, S. J. Caracci, S. A. Maranowski, N. Holonyak, Jr., S. C. Smith, & R. D. Burnham, "Planar native-oxide $Al_xGa_{1-x}As-GaAs$ Quantum Well Heterostructure Ring Laser Diodes", Appl. Phys. Lett. 60, 1582 (1992).

Nathan et al., "GaAs Injection Laser With Novel Mode Control and Switching Properties", J. Appl. Phys. Lett. 36, 473 (1964).

N. K. Dutta et al., "Bistability in Coupled Cavity Semiconductor Lasers", Appl. Phys. Lett. 44, 30 (1984).

(List continued on next page.)

OTHER PUBLICATIONS

N. Yamada et al., "Strained InGaAs/GaAs Single Quantum Well Lasers With Saturable Absorbers fabricated by Quantum Well Intermixing", Appl. Phys. Lett. 60, 2463 (1992).

C. Harder et al., "Bistability And Pulsations In Semiconductor Lasers With Inhomogeneous Current Injection", IEEE J. of Quantum Electronics, vol. Qe–18, 1335 (1982).

D. G. Deppe et al., "Bistability In An AlAs–GaAs–InGaAs Vetical–Cavity Surface–Emitting Laser", Appl. Phys. Lett. 58, 2616 (1991).

K. Aiki et al., "Lasing Characteristics of Disturbed–Feedback GaAs–GaAlAs Diode Lasers With Separate Optical And Carrier Confinement", IEEE J. of Quantum Electronics, vol. Qe–12, 597 Oct., 1976.

J. Jewell, "Surface–Emitting Lasers Reach R&D Threshold", Laser Focus World, May 1990, pp. 151–155.

D. R. Scifres, R. D. Burnham, & W. Streifer, Appl. Phys. Lett. 25, 203, 15 Aug., 1974.

W. T. Tsang, "Lightwave Communications Technology, Part B, Semiconductor Injection Lasers, I", edited by W. T. Tsang in Semiconductors and Semimetals, vol. 22, edited by R. K. Willardson and A. C. Beer (Academic, Orlando, 1985), Chap. 5, pp. 257–373 (no month).

M. Kitamura, M. Yamaguchi, S. Murata, I. Mito, & K. Kobayashi, Electron. Lett. 20, 595 (1984).

D. G. Deppe, D. C. Hall, N. Holonyak, Jr., R. J. Mayti, H. Schichijo, & J. E. Epler, Appl. Phys. Lett. 53, 874, Sep. 5, 1988.

H. G. Winful, J. H. Marburger, & E. Garmire, Appl. Phys. Lett. 35, 379 Sep. 1, 1979.

J. He & M. Cada, IEEE J, Quantum Electron. Qe–27, 1182 5 May, (1991).

SEMICONDUCTOR LASER DEVICE WITH COUPLED CAVITIES

FIELD OF THE INVENTION

This invention relates to semiconductor lasers and, more particularly to semiconductor lasers which exhibit improved properties, including improved single mode operation, optical switching and bistability.

The present invention was made, in part, with Government support, under Army Research Office Contact No. DAAL-03-89-K-0008 and National Science Foundation Grant Nos. ECD-89-83166 and DMR-89-20538. The Government has certain rights in this invention.

BACKGROUND OF THE INVENTION

The high gain required for oscillation in semiconductor lasers results in a large optical bandwidth in which laser operation is possible. This large bandwidth generally results in multiple-longitudinal-mode operation. For many applications, single-longitudinal-mode operation is required. Consequently, sophisticated structures such as the distributed feedback (DFB) laser [see D. R. Scifres, R. D. Burnham, and W. Streifer, Appl. Phys. Lett. 25, 203 (1974)] and the cleaved-coupled-cavity ($C^3$) laser [see W. T. Tsang, Lightwave Communications Technology, Part B, Semiconductor Injection Lasers, I, edited by W. T. Tsang, in Semiconductors and Semimetals, Vol. 22, edited by R. K. Willardson and A. C. Beer (Academic, Orlando, 1985), Chap. 5, pp. 257–373] have been developed to ensure single-mode operation. The DFB laser employs a fine-scale periodic corrugation of relatively small index steps to interact with the electromagnetic wave. The $C^3$ laser relies on several large-scale nonperiodic monolithic cavities for feedback and mode selection.

It is among the objects of the present invention to provide a semiconductor laser that can exhibit desirable single mode operation and can be fabricated using relatively simple techniques.

Optical switching and bistability are important for applications such as optical memories, optical signal processing, and optical logic elements. A variety of semiconductor laser devices have exhibited switching and bistability, including: lasers with saturable absorbers [see M. I. Nathan, J. C. Marinace, R. F. Rutz, A. E. Michel, and G. J. Lasher, J. Appl. Phys. 36, 473 (1965); C. Harder, K. Y. Lau, and A. Yariv, IEEE J. Quantum Electron. QE-18, 1351 (1982); N. Yamada and J. S. Harris, Jr., Appl. Phys. Lett. 60, 2463 (1992)], ordinary tandem coupled-cavity lasers [see N. K. Dutta, G. P. Agrawal, and M. W. Focht, Appl. Phys. Lett. 44, 30 (1984)] and vertical-cavity surface-emitting lasers [see D. G. Deppe, C. Lei, T. J. Rogers, and B. G. Streetman, Appl. Phys. Lett. 58, 2616 (1991)].

It is among the further objects of the present invention to provide a semiconductor laser that exhibits relatively large amplitude switching and bistability in its light versus current characteristics.

SUMMARY OF THE INVENTION

In a form of the invention an array of coupled cavities (called minicavities) of a QWH semiconductor laser are defined by a native oxide of an aluminum-bearing III-V semiconductor material and are arranged serially end-to-end along the longitudinal direction (the primary direction of the laser energy). The native oxide confines the injected carriers and optical field within the cavities, resulting in reflection and optical feedback distributed periodically along the laser stripe. Single-longitudinal-mode operation is exhibited over an extended range (relative to similar diodes fabricated without multiple cavities). At high current injection levels, longitudinal-mode spectra demonstrate oscillation from the internal coupled cavities.

In a further form of the invention, two linear arrays of end-coupled minicavities are arranged side by side to obtain a two dimensional array, with resultant lateral coupling between the linear arrays. The two dimensional array exhibits mode switching and multiple switching in the light power (L) versus current (I) characteristic (L-I) with increasing current.

In another form of the invention, a stripe laser is transversely coupled (or side-coupled) with a linear array of end-coupled minicavities. Bistability and switching are demonstrated in the light versus current (L-I) characteristic of a native-oxide-defined structure of this type. The device, with internally coupled elements and the current partitioned among the elements, exhibits a large hysteresis in the L-I curve, with switching from the stimulated to the spontaneous regime occurring over substantial power (light) and current ranges. The linear array of "minilasers" and its resonance modulates and switches the stripe laser operation.

In accordance with a further definition of the invention, a semiconductor laser device includes first and second adjacent laser units formed on the same semiconductor substrate, each of the units including a laser cavity. The laser cavity of the first unit has a substantially different longitudinal mode selection characteristic than the laser cavity of said second unit. [As used herein, substantially different longitudinal mode section characteristics means that the first unit has a cavity mode spacing that is at least 10 percent greater that the cavity mode spacing of the second unit, and/or a primary emission wavelength that is at least 50 Å greater than the primary emission wavelength of the second unit.] Means are provided for applying energizing signals to the first and second units to obtain laser emission from the units and lateral coupling between the cavities of the units.

In an embodiment of the invention there is disclosed a semiconductor laser device that includes a semiconductor active region disposed between first and second semiconductor confining layers. An electrode array has electrode elements coupled with the first confining layer. [As used herein, the term "electrode elements" is intended to include electrical contact regions (e.g. highly doped semiconductor regions) that contact an underlying semiconductor structure.] At least one opposing electrode is coupled with the second confining layer. The electrode elements of the array are spaced apart and form a two-dimensional array that includes a plurality of electrode elements along a line and at least one further electrode element laterally spaced from the electrode element of said line. Means are provided for applying electrical signals between the electrode elements and the at least one further electrode element and the opposing electrode to effect light emission in the active regions defined under the plurality electrode elements and at least one active region defined under the at least one further electrode element, and to effect lateral coupling of the emissions.

Further features and advantages of the invention will become more readily apparent from the following detailed description when taken in conjunction with the accompanying drawings.

DETAILED DESCRIPTION

In a first example hereof, a quantum well heterostructure is grown by metal-organic chemical vapor deposition ["MOCVD" —see for example, R. D. Dupuis et al., Proceedings of The International Symposium on GaAs and Related Compounds, pp. 1-9, Institute of Physics, London, 1979, and M. J. Ludowise, J. Appl. Phys., 58, R31, 1985] on an n-type GaAs substrate. After n-type buffer layers of GaAs (~0.5 μm) and an $Al_{0.23}Ga_{0.77}As$ (~1 μm) layer, an $Al_{0.5}Ga_{0.5}As$ lower confining layer is grown to a thickness of ~1.5 μm. [The confining layers are also sometimes called cladding layers.] The active region of the quantum well heterostructure is then grown, and includes a ~2100 waveguide region of undoped $Al_{0.23}Ga_{0.77}As$ with ~100 Å undoped GaAs quantum well (QW) grown inside the waveguide region ~700 Å from the lower confining layer. An upper confining layer of p-type $Al_{0.8}Ga_{0.2}As$ is grown to a thickness of about 3500 Å, and a heavily doped p-type GaAs contact layer is grown thereon, the contact layer having a thickness of about 800 Å.

The position of QW is displaced from the center of the waveguide for more effective overlap of the high-gain region with the optical mode, which is displaced towards the substrate due to the asymmetric confining layers. This asymmetry is purposely introduced to minimize the effects of the surface of the laser crystal (located ~3500 Å from the waveguide) by shifting the optical field toward the substrate. The shallow upper confining layer is desirable in order to minimize current spreading, allow finer pattern definition, and improved heat dissipation with the crystal mounted p side "down" and thus the active region closer to the heat sink. The thin upper confining layer structure combined with the p-type metallization may also serve to reflect light emitted toward the surface back into the crystal for improved device properties.

Figure 1:
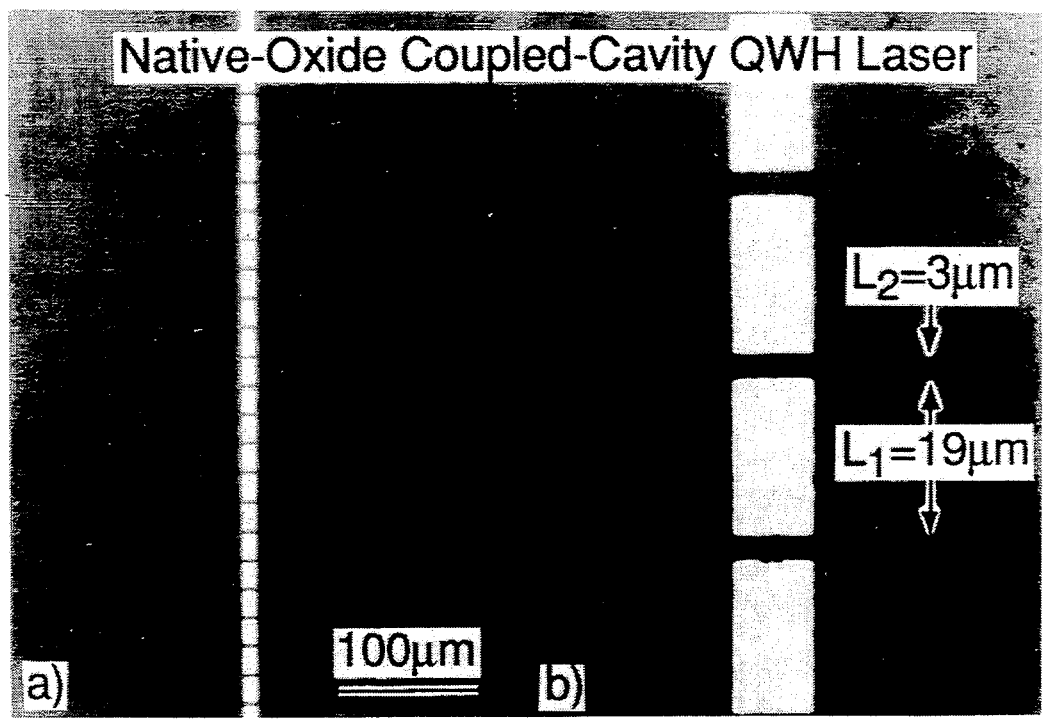
FIG. 1 shows the microscope image of the surface of a native-oxide delineated coupled-cavity $Al_xGa_{1-x}As$-GaAs QWH laser. At low magnification (a) shows the dimensions of a typical laser stripe which contains ~10–25 internal cavities. At higher magnification (b) shows the coupled-cavity geometry: 10 μm-wide minicavities, 19 μm ($L_1$) long, 3 μm ($L_2$) separation, and repeated periodically along the laser stripe.

The laser diode fabrication begins with deposition of ~1000 Å of a $Si_3N_4$ on the crystal surface which is then patterned into repeated (masked) rectangular cavities (19 μm long on 22 μm centers, 10 μm wide) arrange lengthwise in stripes. The $Si_3N_4$ masks the GaAs contact layer from chemical etching ($H_2SO_4:H_2O_2:H_2O$, 1:8:80), leaving the $Al_{0.8}Ga_{0.2}As$ upper confining layer exposed outside of the patterned cavities. The sample is next placed in an open tube furnace, supplied with $H_2O$ vapor in an $N_2$ carrier gas, at 425° C. for 20 min. This process results in the transformation of ~1300 Å of the $Al_{0.8}Ga_{0.2}As$ upper confining layer to native oxide outside of the repeated cavities (see, for example, copending U.S. patent application Ser. No. 721,843 and 860,454, both assigned to the same assignee as the present application). The $Si_3N_4$ is subsequently removed in a $CF_4$ plasma. FIG. 1 shows a photomicrograph of the surface of the crystal after these processing steps. A low-magnification view [FIG. 1(a)] shows a typical multiple cavity single laser stripe. Typical laser bars are cleaved into about 250-500 μm lengths (perpendicular to the linear arrays of rectangular minicavities) and thus contain 10-25 coupled minicavities. The higher-magnification view in FIG. 1(b) shows the coupled-cavity geometry, each cavity being 19 μm ($L_1$) long, spaced 3 μm ($L_2$) apart, and 10 μm wide.

To improve the contacts the crystal is sealed in an evacuated quartz ampoule and Zn diffused ($ZnAs_2$ source, 540° C., 20 min) to increase the cap doping The diodes are then lapped and polished, metallized with Ti-Au for the p-type contact and Ge-Ni-Au for the n-type contact, cleaved, diced, and mounted on In-coated copper heat sinks for continuous (cw) operation.

Figure 2:
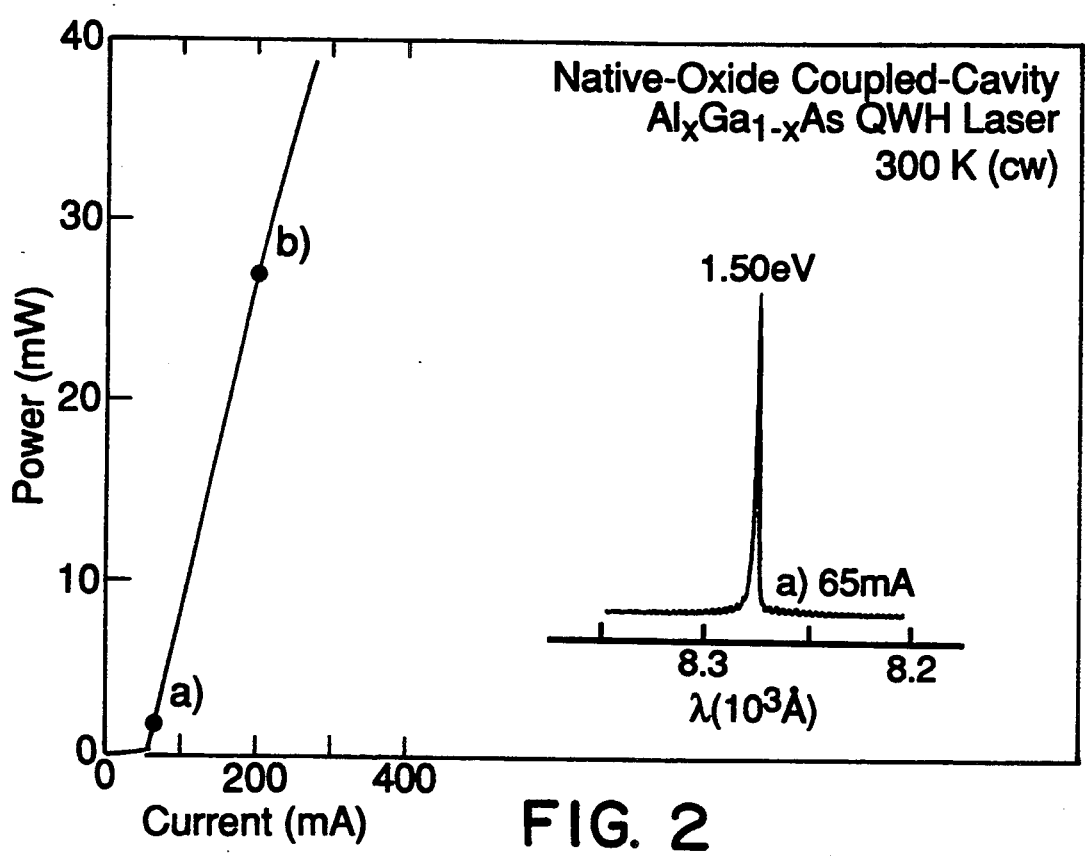
FIG. 2 shows the continuous (cw) 300 K light output (single facet) vs current (L-I) characteristic of a native-oxide coupled-cavity $Al_xGa_{1-x}As$-GaAs QWH laser (uncoated facets, ~250 μm total cavity length) of the form of FIG. 1 The threshold current is 55 mA, with an abrupt "corner" at threshold similar to that observed in DFB lasers. Single-longitudinal-mode operation occurs at 65 mA at $\lambda=8275$ [inset and (a)] and extends up to (b) 200 mA.

FIG. 2 shows the light versus current (L-I) curve of a diode mounted p side down on a Cu heat sink under 300 K cw operation. The threshold current is 55 mA (uncoated facets, about 250 μm total bar length), with the L-I characteristic exhibiting a sharp turn-on at threshold. Such a sharp corner is due to reflections from the internal coupled cavities and is similar to that observed in DFB laser diodes [see M. Kitamura, M. Yamaguchi, S. Murata, I. Mito, and K. Kobayashi, Electron Lett. 20, 595 (1984)] and laser diodes with naturally occurring microcracks perpendicular to the laser stripe [see D. G. Deppe, D. C. Hall, N. Holonyak, Jr., R. J. Mayti, H. Schichijo, and J. E. Epler, Appl. Phys. Lett. 53, 874 (1988)]. Single-longitudinal-mode operation occurs at a current of 65 mA $\lambda \approx 8275$ Å [FIG. 2(a) and inset] and extends up to ~200 mA [FIG. 2(b)] where a second longitudinal mode also appears. This large range (~$I_{th}$ to ~$4I_{th}$) of single-mode operation is attributable to the coupling and reflection of the wave between cavities, similar to that observed in DFB [see D. R. Scifres, R. D. Burnham, and W. Streifer, Appl. Phys.. Lett 25, 203 (1974); M. Kitamura, M. Yamaguchi, S. Murata, I. Mito, and K. Kobayashi, Electron Lett. 20, 595 (1984)] and $C^3$ lasers [see W. T. Tsang, Lightwave Communications Technology, Part B, Semiconductor Injection Lasers, I, edited by W. T. Tsang, in Semiconductors and Semimetals, Vol. 22, edited by R. K. Willardson and A. C. Beer (Academic, Orlando, 1985), Chap. 5, pp. 257-373]. Comparison lasers fabricated without multiple cavities (native-oxide-defined 10 μm-wide stripes) exhibit a limited range of single-mode operation (~$I_{th}$ to $<2I_{th}$). The total external differential quantum efficiency ($\eta$) is 27% (up to 10 mW). The somewhat low efficiency and high threshold current of this device are due to the presence of the unpumped absorbing reflectors between the minicavities along the laser stripe, making up ~14% of the total bar length.

Figure 3:
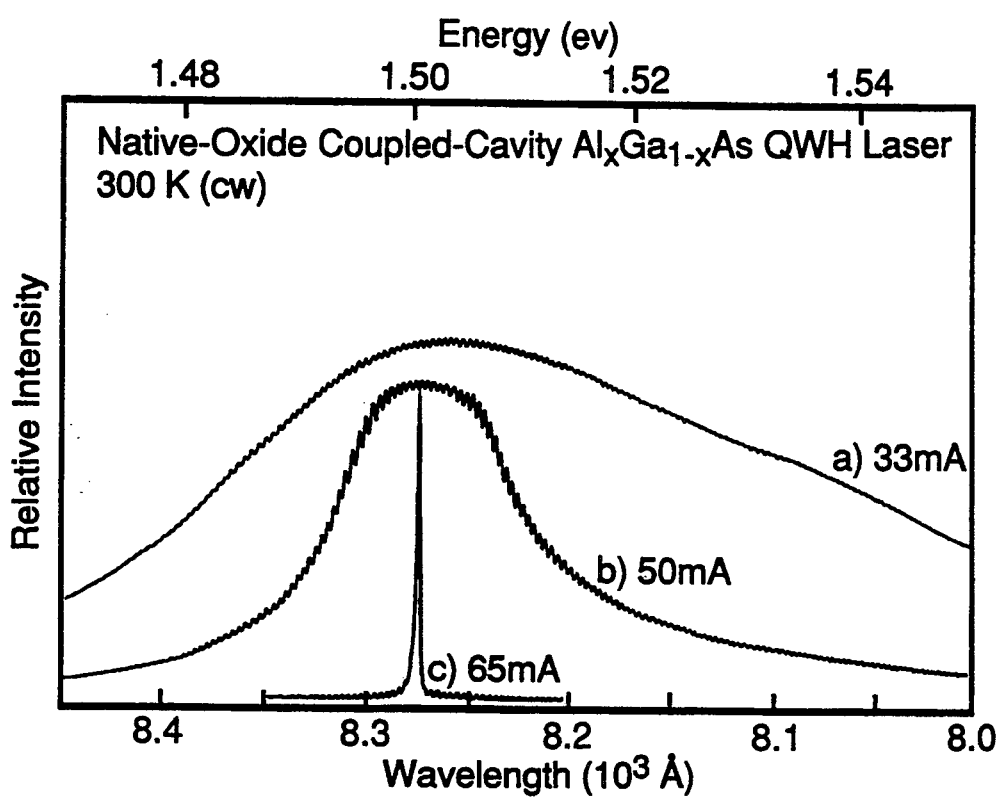
FIG. 3 shows continuous 300 K spectral-narrowing behavior of the laser diode of FIG. 2 at (a) 33 mA, (b) 50 mA, and (c) 65 mA. At (b) 50 mA (just below threshold), the spectrum exhibits a trapezoidal appearance and high degree of spectral ringing due to coupled-cavity effects.

Further 300 K cw spectral data are shown in FIG. 3. At 33 mA [FIG. 3(a)] the spontaneous emission is relatively broad with a full width at half maximum (FWHM) of 363 Å, but still showing some spectral ringing. As threshold is approached, the spectrum narrows with a FWHM of 107 Å at 50 mA [FIG. 3(b)]. The shape of this spectrum is unlike that of conventional diodes, showing an unusual trapezoidal appearance and considerable ringing. These features are attributed to the internal feedback provided by the coupled cavities since simple 10 μm-wide oxide-defined stripe lasers do not exhibit this behavior. Single-mode operation is well developed at 65 mA [FIG. 3(c)] $\lambda = 8275$ Å (1.50 eV). Single-mode operation persists at higher injection currents. However, the mode position shifts continuously to lower energy, reaching $\lambda = 8317$ Å at 150 mA (data not shown). These shifts may be due to heating effects or increasing carrier injection changing the effective index of refraction between internal cavities. Such a change modifies the properties of the reflecting regions, varying the resonance conditions and longitudinal-mode selection of the cavities.

Convincing evidence of oscillation from the internal cavities is shown in the 300 K cw spectral data of FIG.

Figure 4:
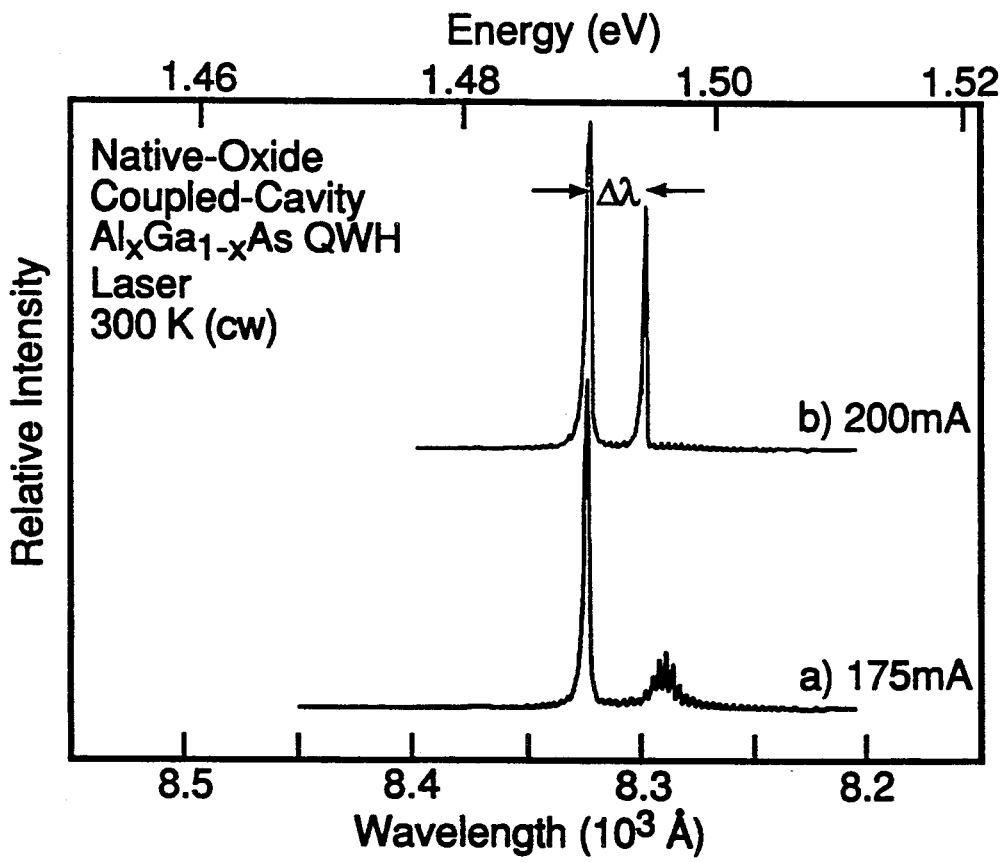
FIG. 4 shows high-level 300 K cw longitudinal-mode spectra of the laser diode of FIGS. 2 and 3. At (a) 175 mA a second set of high-energy cavity modes appears with the original single mode. The packet of modes narrows to a single mode at (b) 200 mA, with a spacing between modes of $\Delta\lambda\sim 25$ Å, corresponding to the oscillation of two 19 μm microwaves.

4. At 175 mA [FIG. 4(a)] a set of higher energy cavity modes appears. Discrete packets of modes such as these have been observed in other lasers containing internal cavities formed by naturally occurring microcracks [see D. G. Deppe, D. C. Hall, N. Holonyak, Jr., R. J. Mayti, H. Schichijo, and J. E. Epler, Appl. Phys. Lett. 53, 874 (1988)]. At 200 mA this set of modes narrows to a single mode, $\lambda=8298$ Å, which is spaced $\Delta\lambda \sim 25$ Å[FIG. 4(b)] from the single mode at $\lambda=8323$ Å. This spacing corresponds to that expected for a 38 μm cavity length, indicating that two microcavities (each 19 μm, FIG. 1) define the laser operation and spectral behavior. Two microcavities may be required for reasons of gain and reflection to permit laser oscillation.

The reflection between cavities is provided by the $Al_xGa_{1-x}As$ native oxide, which possesses a low index of refraction ($n \approx 1.60$). Slight overetching of the GaAs cap and the shallow upper confining layer result in the native oxide being only $\sim 1800$ Å away from the edge of the waveguide region (as verified by scanning electron microscope images, data not shown). The optical field extends into the upper confining layer and thus interacts strongly with the native oxide, providing a real index step between cavities. Calculations based on propagation in a four-layer slab waveguide [see G. E. Smith, IEEE J. Quantum Electron. QE-4, 288 (1968)] indicate an index step of $\sim 1 \times 10^{-3}$ between the minilasers and native-oxide reflecting regions. In addition, the native oxide possesses excellent insulating characteristics [see e.g. J. M. Dallesasse and N. Holonyak, Jr., Appl. Phys. Lett. 58, 394 (1991)], which, combined with the shallow upper confining layer, allows little current spreading under the native-oxide capped regions. This results in a difference in carrier density between the native-oxide (reflecting) regions and the active minicavities, thus providing a difference in the imaginary part of the refractive index. Hence, the presence of the native oxide causes changes in both the real and imaginary part of the refractive index, resulting in reflection between the minicavities.

The description in conjunction with FIGS. 1-4 demonstrates a laser diode comprising a linear array of small rectangular internal coupled cavities delineated by oxidation of the high-gap $Al_xGa_{1-x}As$ upper confining layer. The native oxide provides reflection and feedback of the optical wave between minicavities and results in an increased range of single-longitudinal-mode operation, reminiscent of DFB and $C^3$ laser operation. Under high current injection, the longitudinal-mode spacing is consistent with the geometry of the linear array of active rectangular cavities in the laser stripe. Optimization of the number, size spacing, and degree of periodicity of the minicavities or minilasers, as well as the size of the index step (native oxide thickness—see the above-referenced copending U.S. patent application Ser. No. 860,454, assigned to same assignee as the present application) may produce enhanced performance of these devices.

Figure 5:
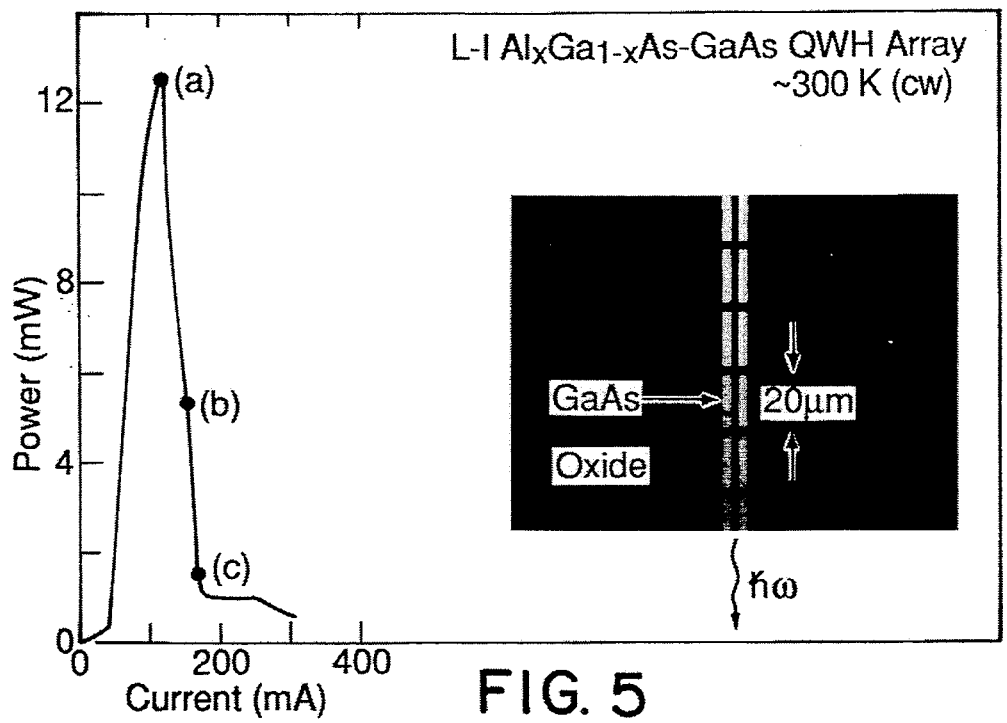
FIG. 5 shows continuous (cw) 300 K light output (single facet) versus current characteristic (L-I) of a native-oxide-defined two-dimensional (2-D) coupled-cavity $Al_xGa_{1-x}As$-GaAs QWH laser array (uncoated facets, ~300 μm total cavity length). The threshold is 45 mA, and the power peaks at ~12.5 mW (115 mA). The inset shows a surface photomicrograph of the unmetallized 2-D twin linear array. The rectangular minicavities are 4 μm wide, 19 μm long, and separated end-to-end by ~3 μm. The two coupled linear arrays are separated by ~1 μm.

In a further form of the invention, described beginning with FIG. 5, the QW heterostructure crystal is substantially the same as that described above in conjunction with the device of FIGS. 1-4. In the present embodiment, the laser diode array is fabricated by patterning $\sim 1000$ Å of $Si_3N_4$ into repeated (masked) rectangular cavities ($\sim 19$ μm long, $\sim 4$ μm width, $\sim 3$ μm end-to-end spacing), which are arranged lengthwise in two parallel stripes with $\sim 1$ μm separation. The exposed GaAs cap is then removed by chemical etching ($H_2SO_4:H_2O_2:H_2O$, 1:8:80) and the crystal is placed in an open-tube furnace (supplied with a $N_2$ carrier gas bubbled through $H_2O$ at $\sim 95°$ C.) at 425° C. for 20 min. As above, this process results in the transformation of $\sim 1300$ Å of the $Al_{0.8}Ga_{0.2}As$ upper confining layer to native oxide outside of the repeated cavities. The $Si_3N_4$ is then removed in a $CF_4$plasma. The inset of FIG. 5 shows a photomicrograph of the surface of the crystal after these processing steps. In order to increase the doping in the rectangular GaAs contact areas, the crystal is sealed in an evacuated quartz ampoule and is shallow Zn-diffused ($ZnAs_2$ source, 540° C. for 20 min). The crystal is then lapped and polished (on the substrate side) to a thickness of $\sim 100$ μm, and is metallized with Ti-Au across the oxide and the p-type GaAs "contacts" and with Ge-Ni-Au on the n-type substrate side. The sample is then cleaved into 250–500 μm wide Fabry-Perot resonators, diced, and individual dies are mounted p-side down on In-coated Cu heat sinks for continuous (cw) operation.

Figure 6:
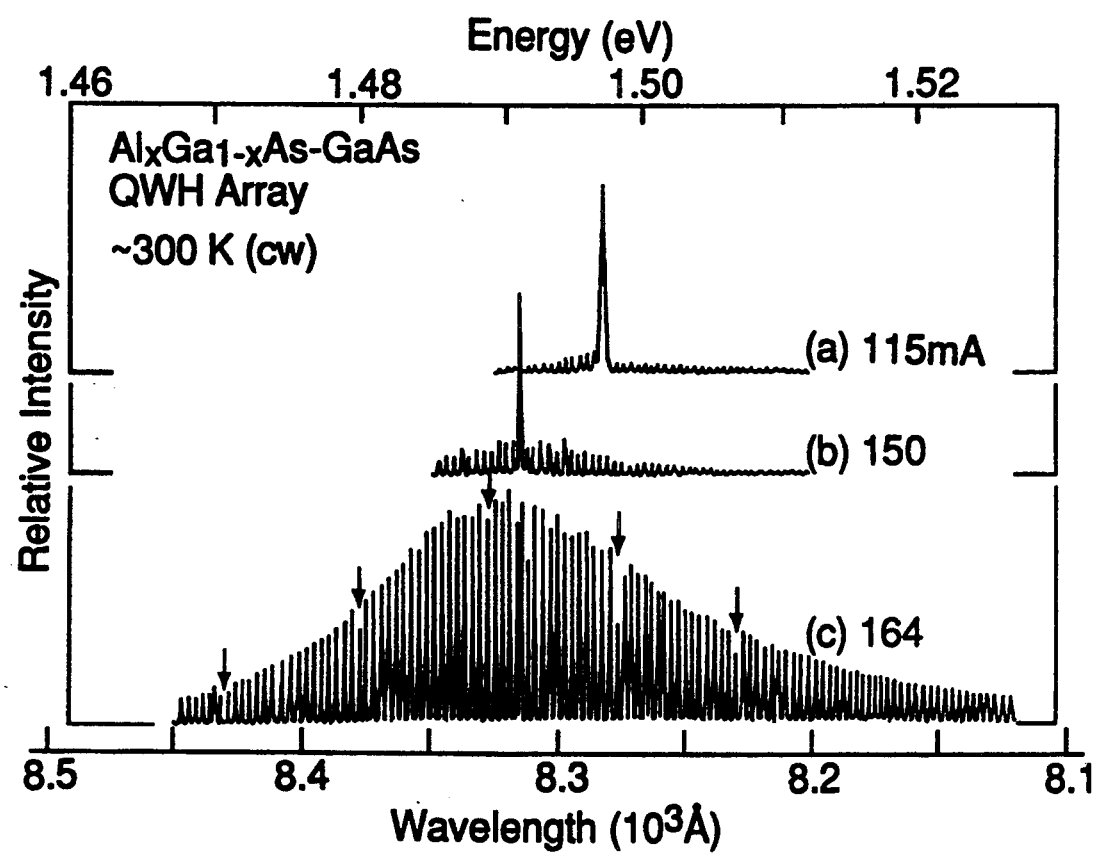
FIG. 6 shows longitudinal mode spectra (cw, 300 K) of the diode of FIG. 5 at (a) 115, (b) 150, and (c) 164 mA (points shown on the L-I of FIG. 5). The single mode behavior at (a) 8280 Å (115 mA) shifts to 8313 A at (b) 150 mA. At (c) 164 mA single mode operation has switched off and the resonances of the 19 μm long minicavities are evident and marked with arrows. The mode spacing is ~50 Å, which agrees with the 19 μm minicavity length.

The unusual switching behavior of the resultant 2-D stripe lasers is evident from the L-I characteristic shown in FIG. 5, which, after reaching a peak in power of $\sim 12.5$ mW at (a) 115 mA, decreases over 50% in power from (a) 115 to (b) 150 mA, and simultaneously shifts its single mode operation (FIG. 6) to longer wavelength. At (c) 164 mA (FIG. 6) the single mode operation of (a) and (b) has switched off, and in the broad spectrum of (c) 164 mA the resonances of the 19 μm long minicavities are evident and marked with arrows. In the broad spectral region of weak stimulated emission, the minicavities tend to store photons, making the mode amplitudes (marked with arrows) smaller (FIG. 6c). Note that the mode structure near the peak of the spectrum in FIG. 6(c) is sufficiently complicated that it is not evident that at (b) 150 mA the single mode laser operation has shifted fully, from (a) 115 mA, to a minicavity resonance (e.g., $\Delta\hbar\omega \sim 6$ meV vs. $\Delta E \sim 9$ meV from resonance to resonance). It is evident from (a) to (b) to (c) in FIGS. 5 and 6, however, that single mode operation is turning-off and multimode operation, and weaker stimulated emission, is turning-on as the current is increased.

Figure 7:
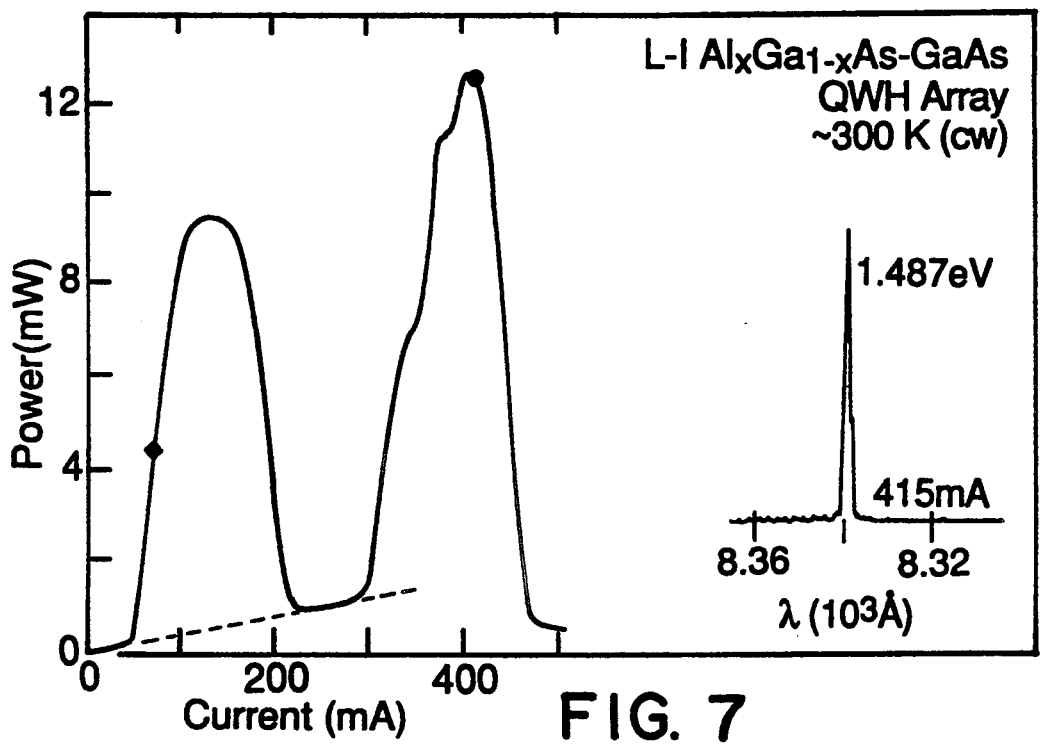
FIG. 7 shows the light output versus current characteristic (L-I, cw, 300 K) of a diode with the same geometry as that shown in FIG. 5. The diode turns on and off twice as the current is increased. The dashed line shows that the emission intensity in the valley region is in the range of spontaneous emission. The inset shows single mode behavior (8340 Å) persists to at least 415 mA ($\sim 8I_{th}$), and is marked with a solid dot on the L-I curve.

The unusual switching behavior of these 2-D array QWH stripe laser diodes is much more evident in FIG. 7. The L-I characteristic shows that, with increasing current, the laser turns on and off twice. As shown by the inset, which corresponds to the peak of the L-I characteristic (>12 mW, 415 mA, marked), single mode operation still occurs. In the valley region between 220 and 300 mA, broad-spectrum multi-mode operation similar to that of FIG. 6(c) occurs (data not shown). As the dashed line of FIG. 7 shows, the emission intensity in this region is at or somewhat above spontaneous emission. Most of the 2-D array lasers examined behaved as shown in FIG. 7.

Figure 8:
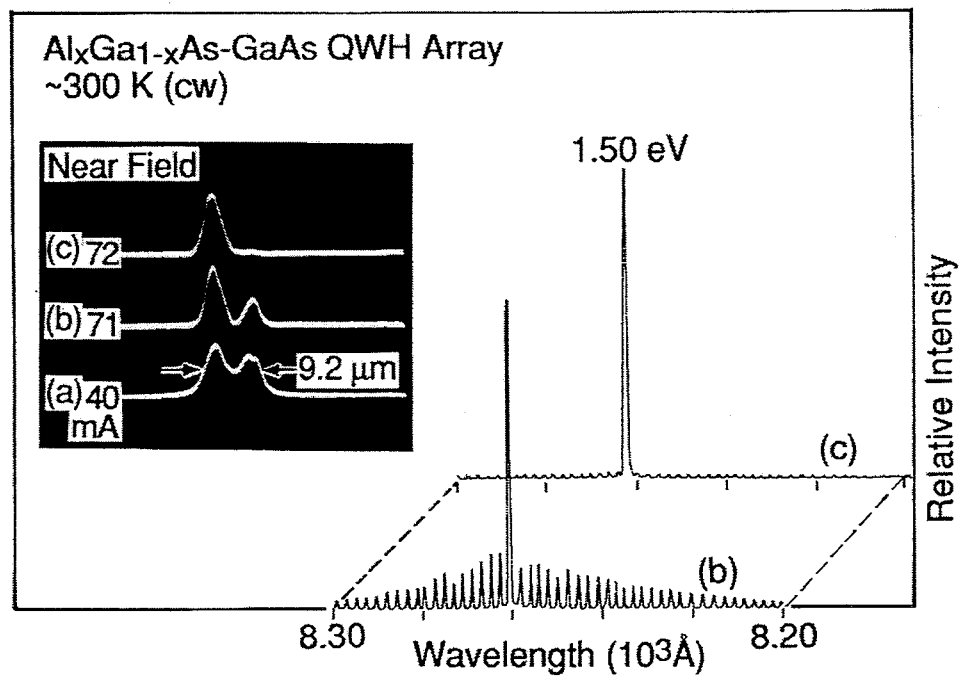
FIG. 8 shows the near field (NF) emission patterns and longitudinal mode spectra of the diode of FIG. 7 near the diamond-shaped point at ~70 mA on the L-I characteristic. At (a) 40 mA (spontaneous regime) the near field (NF) shows two intensity peaks of the twin linear array, with the width of 9.2 μm in accord with the geometry shown in FIG. 5. At (b) 71 mA the NF is twin lobed, with the device operating single mode (8260 Å) but with also strong satellite longitudinal modes. At (c) 72 mA, the NF emission from the right stripe disappears abruptly, with also an abrupt disappearance of the satellite longitudinal modes.

The data of FIG. 8 show in some detail the behavior of the diode of FIG. 7 near the diamond-shaped point located at $\sim 70$ mA on the L-I characteristic. For comparison, at (a) 40 mA in the spontaneous regime the near field (NF) exhibits two intensity peaks expected of a twin linear array, with the spacing of 9.2 μm agreeing with the 2-D array width shown in the inset of FIG. 5. At (b) 71 mA the near field still exhibits twin intensity peaks, and the spectrum a single main mode corresponding to the left NF peak and significant satellite longitudinal modes corresponding to the right NF peak. A small current change of 1 mA (71→72 mA) produces abrupt switching: The satellite longitudinal modes (FIG. 8c) vanish abruptly, and simultaneously the right NF emission peak. It is clear that the strong coupling of one side of the diode interferes, constructively or destructively, with the other side of the diode. Also it is evident that the manner in which the current has been partitioned among many identical coupled rectangular minicavities insures that the resonant operation between the cavities is favored.

The data of FIGS. 5-8 demonstrates a laser diode having two parallel linear arrays of small coupled rectangular cavities delineated by oxidation of the high-gap $Al_xGa_{x-1}As$-GaAs QWH. The two dimensional laser array exhibits mode switching and switching in the L-I characteristic with increasing current. Depending on the bias position (current) on the L-I curve, the laser operates in a single longitudinal modes in or near the spontaneous regime. For example, the resonances of the minicavities are evident in the spontaneous spectra in spite of small heating effects and carrier-induced changes in dielectric properties. As above, optimization of the geometry, size, and number of the minicavities, and their coupling, may result in improved behavior of these devices.

Figure 9:
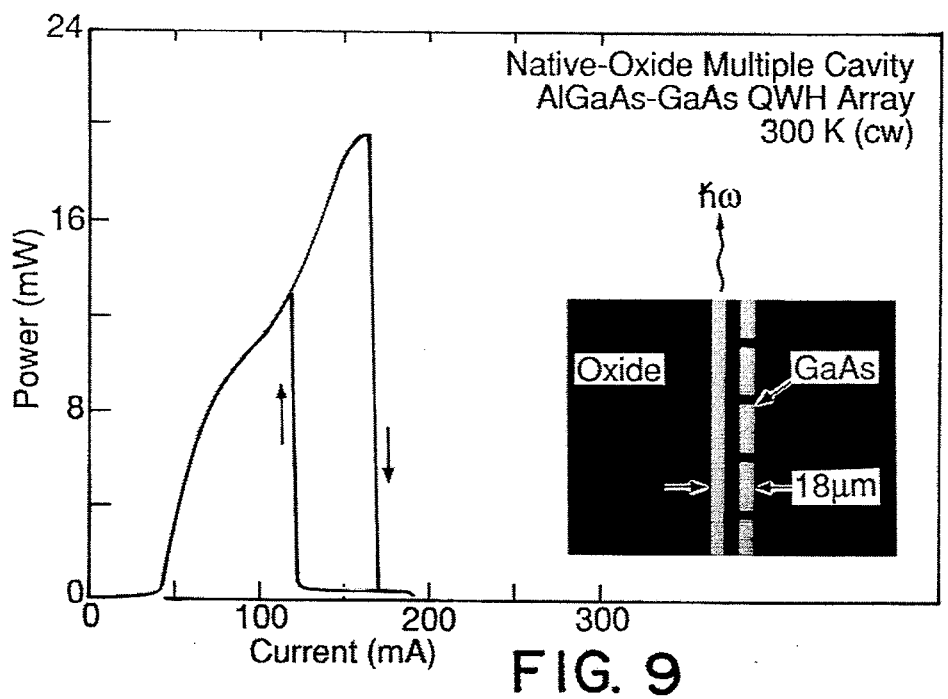
FIG. 9 shows the continuous 300 K light output (single facet, uncoated) versus current characteristic (L-I) of a native-oxide-defined $Al_xGa_{1-x}As$-GaAs single laser stripe side-coupled to a linear array of end-coupled minilasers. The laser threshold is 32 mA, with abrupt switching from the stimulated (ON) to spontaneous (OFF) regime occurring at 168 mA. The device exhibits bistability, switching back sharply from the spontaneous (OFF) to stimulated (ON) regime at 123 mA. The diode geometry (prior to metallization) is shown in the inset and consists of a single ~6 μm-wide laser stripe side-coupled (~5 μm away) to a linear array of end-coupled minilasers (6 μm-wide, 19 μm long and 22 μm centers).

In another form of the invention, described beginning with FIG. 9, the QW heterostructure crystal is substantially the same as the one described above in conjunction with the previous devices. In the present embodiment, the laser diode array is fabricated by first depositing ~1000 Å of $Si_3N_4$ on the crystal surface, which is then patterned into end-to-end repeated (masked) rectangular cavities (minicavities, 6 μm wide and 19 μm long on 22 μm centers) arranged lengthwise. Next, 6 μm photoresist (PR) stripes are patterned ~5 μm away from the linear array of minicavities. The patterned PR and $Si_3N_4$ then serve as a mask for the chemical etching ($H_2SO_4:H_2O_2:H_2O$, 1:8:80) of the GaAs cap layer, leaving the high-gap $Al_xGa_{1-x}As$ exposed outside of the patterned regions. The PR is then removed and the sample is placed immediately in an open-tube furnace (425° C.) supplied with $H_2O$ vapor in an $N_2$ carrier gas for 20 min. Again, this process results in the conversion of the exposed high-gap $Al_xGa_{1-x}As$ to a low-index (n ~1.6) insulating native oxide located ~1000 Å above the QWH waveguide region. The patterned $Si_3N_4$ and unetched GaAs regions are unaffected by this treatment. The patterned $Si_3N_4$ is then removed in a $CF_4$ plasma. The inset of FIG. 9 shows the surface of the device after these processing steps. Next the sample is Zn-diffused (540° C., 20 min) to increase the doping in the contact regions (labeled "GaAs" in FIG. 9). The crystal is then lapped and polished to a thickness of ~125 μm and, again, metallized over the entire top surface with Ti-Au for p-type contacts and with Ge-Ni-Au for n-type contacts. Finally the crystal is cleaved, diced, and individual dies mounted on In-coated copper heat sinks for continuous (cw) operation.

The large amplitude switching properties of the single-stripe laser coupled to the active linear array are shown by the 300 K continuous (cw) L-I curve of FIG. 9. The laser threshold current is 32mA, and laser operation persists up to a current of 168 mA. At this point the diode switches abruptly from stimulated emission, ON (19.6 mW/facet, uncoated), to the spontaneous regime, OFF (0.4 mW/facet, uncoated). This behavior corresponds to a large ON:OFF power ratio of 49. These are inherently nonlinear devices, and exhibit bistable operation with a large hysteresis. As the current is decreased (returned) to 123 mA, the diode switches back from the spontaneous regime, OFF, to the simulated regime, ON. For further current increase beyond 168 mA, after the device has switched OFF with increasing current, only a slight increase in the spontaneous output is observed until failure at 187 mA. We mention that, although hysteresis occurs in the L-I characteristics, no hysteresis is observed in the current versus voltage (I-V) characteristics of these devices.

Figure 10:
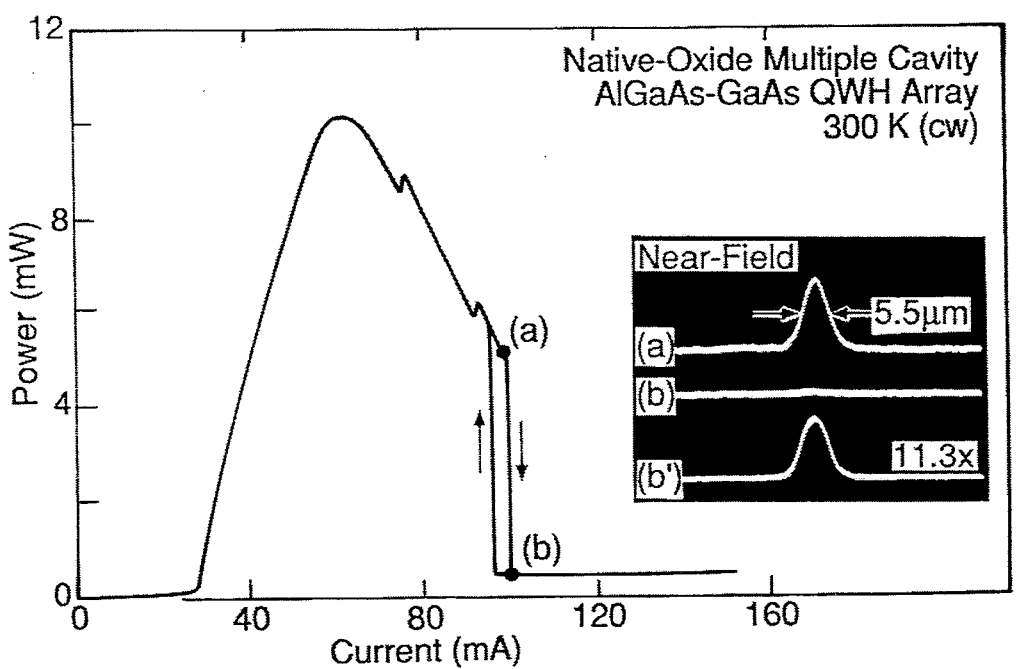
FIG. 10 shows the continuous 300 K light output (single facet, uncoated) versus current characteristic (L-I) of a device of the form of FIG. 9 (inset). The laser exhibits a threshold of 27 mA, with switching and bistability occurring in the range 96–100 mA. Throughout the entire operating range, the device output consists essentially of a ~5.5 μm Gaussian near-field (NF) pattern from the single continuous stripe of FIG. 9. The NF pattern is shown just before switching at (a) 99 mA (inset). After switching at (b) 100 mA, essentially no output is observed; on a higher sensitivity scale (b'), however, the same NF pattern is revealed.

The L-I characteristic (cw 300 K) of another diode exhibiting similar switching behavior is shown in FIG. 10. The laser threshold current is 27 mA, with the device exhibiting essentially a single ~5.5 μm-wide Gaussian near-field pattern (data not shown). This intensity pattern corresponds to laser operation of the ~6 μm wide uniform stripe (inset of FIG. 9), which is expected to reach threshold before the segmented linear array. From gain-loss considerations, the linear array with its repeated unpumped absorbing sections should have a higher laser threshold.

Throughout the entire operating range, a single-stripe nearfield pattern persists, i.e., only very weak output is observed from the linear array portion of the device. The near-field pattern (300 K, cw operation) at (a) 99 mA just before the switching from ON to OFF, i.e., before switching from single-mode stimulated emission to spontaneous emission, is shown in the inset of FIG. 10. Similar to operation just above threshold, only a ~5.5 μm Gaussian near-field is observed at significant amplitude. After the diode switches OFF at (b) 100 mA, no pattern is observed on the same sensitivity scale of the CCD detector. However, at higher sensitivity (11.3x), emission from the same aperture (~5.7 μm) is observed (b'). This near-field pattern also is observed as the laser is switched back from OFF to ON. These data indicate unambiguously that only the uniform laser stripe provides much of the optical output of the system. The side-coupled linear array serves mainly to effect the interferences and switching, ON-OFF, and does not contribute primarily to the optical output.

Further understanding of the operation of these diodes is obtained by examining the output spectra. Somewhat above the threshold at 30 mA, the diode of FIG. 10 operates in a single longitudinal mode ($\lambda \sim 8353$ Å, data not shown). This behavior continues to the peak of the L-I curve of FIG. 10 (63 mA), where the single mode operation "hops" to longer wavelength ($\lambda \sim 8367$ Å, data not shown). Throughout the entire stimulated emission operating regime (30→99 mA), the output occurs in a well developed single longitudinal mode. For example, at 63 mA the laser exhibits a side-mode suppression of 29 dB. The mode hopping, and corresponding structure in the L-I curve (FIG. 10), is attributed to the interaction (interference) of the single laser stripe with side-coupled active linear array and its resonances and stop bands.

Figure 11:
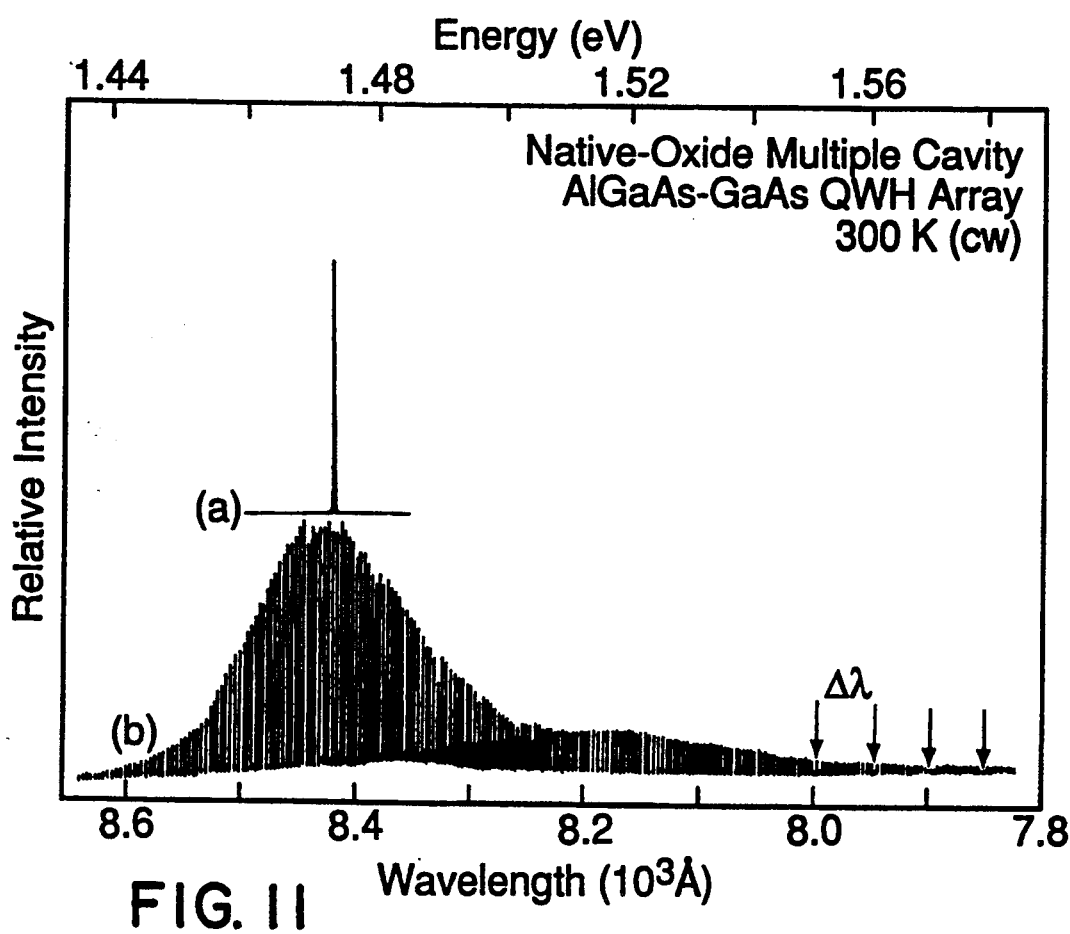
FIG. 11 shows longitudinal mode spectra (cw, 300 K) of the diode of FIG. 10 corresponding to single mode stimulated emission (ON) at (a) and switched OFF to spontaneous emission at (b). Single mode laser operation is observed from threshold (~27 mA) to (a) ~99 mA, with output at large amplitude from only the continuous stripe of the diode (left stripe in FIG. 9 inset). In the spontaneous emission OFF regime (b) the lower energy group of modes corresponds to the laser stripe and the higher energy group of modes to the linear array (see inset of FIG. 9).

Longitudinal mode spectra in the higher-current switching regime of the device of FIG. 10 are shown in FIG. 11. Immediately before switching from ON (stimulated emission) to OFF (spontaneous regime), (a) in FIG. 10, the laser operates in a single longitudinal mode at $\lambda \sim 8415$ Å, which is shown as (a) in FIG. 11. When the diode switches OFF to the spontaneous regime, (b) of FIG. 10, the longitudinal mode spectra appear as shown in (b) of FIG. 11. At this point, the output consists of the spontaneous emission of the single stripe laser (group of lower energy modes) and the linear array (group of higher energy modes). The coupling of the linear array to the stripe laser leads to interference. The resonances of the minicavities of the linear array are apparent (clearer in the laboratory data) at higher energy in the spectrum of FIG. 11(b) and are marked with arrows. The spacing of these resonances ($\Delta\lambda \sim 50$ Å) corresponds to the $\sim 19$ μm minicavity length shown in the inset of FIG. 9. It is noted that the output in the OFF spontaneous regime (FIG. 11(b)) differs significantly from that observed in the spontaneous regime below laser threshold ($\leq 27$ mA), where only the longitudinal mode output of the single laser stripe (group of lower energy modes) is observed (data not shown).

The described switching and storage are fundamentally different from previously reported switching laser devices. The ON-OFF switching behavior occurs in this embodiment in a single unbroken or uninterrupted laser stripe. The switching behavior is owing to the influence (via sidewise coupling) of an active linear array. The switching and bistability is effected by the periodic structure of the linear array (see H. G. Winful, J. H. Marburger, and E. Garmire, Appl. Phys. Lett. 35, 379 (1979); J. He and M. Cada, IEEE J. Quantum Electron. QE-27, 1182 (1991)) and the obvious inhomogeneus carrier distribution, and inhomogeneous operation, resulting from the native-oxide patterning of the array.

Thus, this embodiment sets forth a new form of optical switching element in which a conventional single-stripe laser is side-coupled to a linear array of coupled minilasers. The resulting many-element twin-stripe laser is easily realized via native-oxide device processing. The planar devices exhibit large hysteresis in the L-I curve, with large amplitude switching from the peak of the stimulated emission regime (ON) to the spontaneous regime (OFF). Changes in the coupling, e.g., the spacing between the laser stripe and linear array and between the array elements, and in the geometry of the structure should improve the switching behavior of these lasers. Independent control of the current (carrier population) in the single laser stripe in the linear array, e.g., via a third terminal electrode, should allow control of the switching behavior, and other variations are possible.

Figure 12:
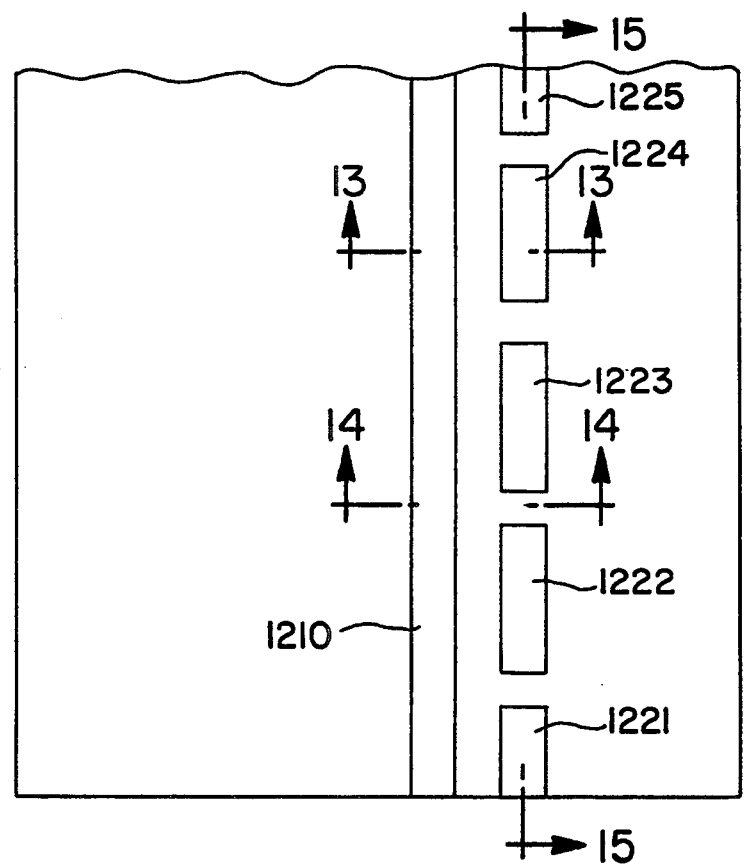
FIG. 12 is diagram of a portion of the top surface of the device described in conjunction with FIGS. 9–11.
Figure 13:
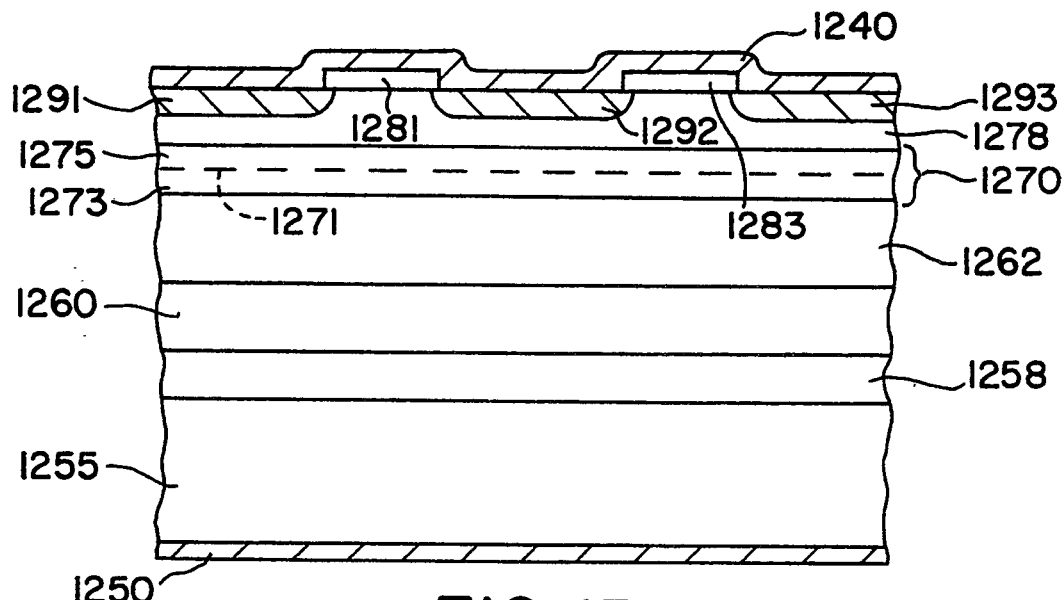
FIG. 13 is a cross-sectional diagram (not to scale), as taken through a section of the FIG. 12 device defined by arrows 13—13.
Figure 14:
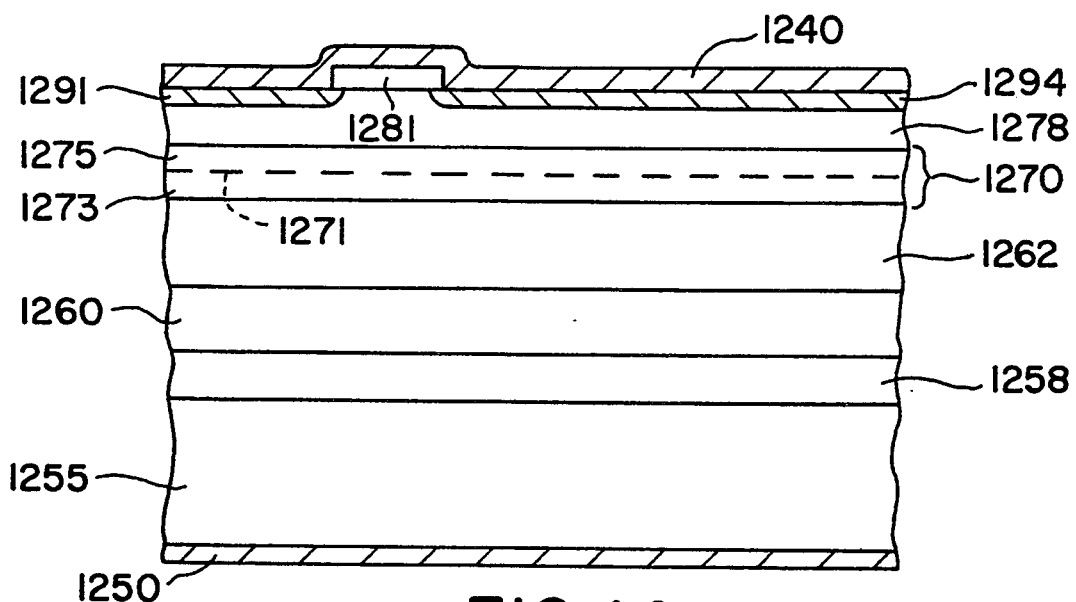
FIG. 14 is a cross-sectional diagram (not to scale), as taken through a section of the FIG. 12 device defined by arrows 14—14.
Figure 15:
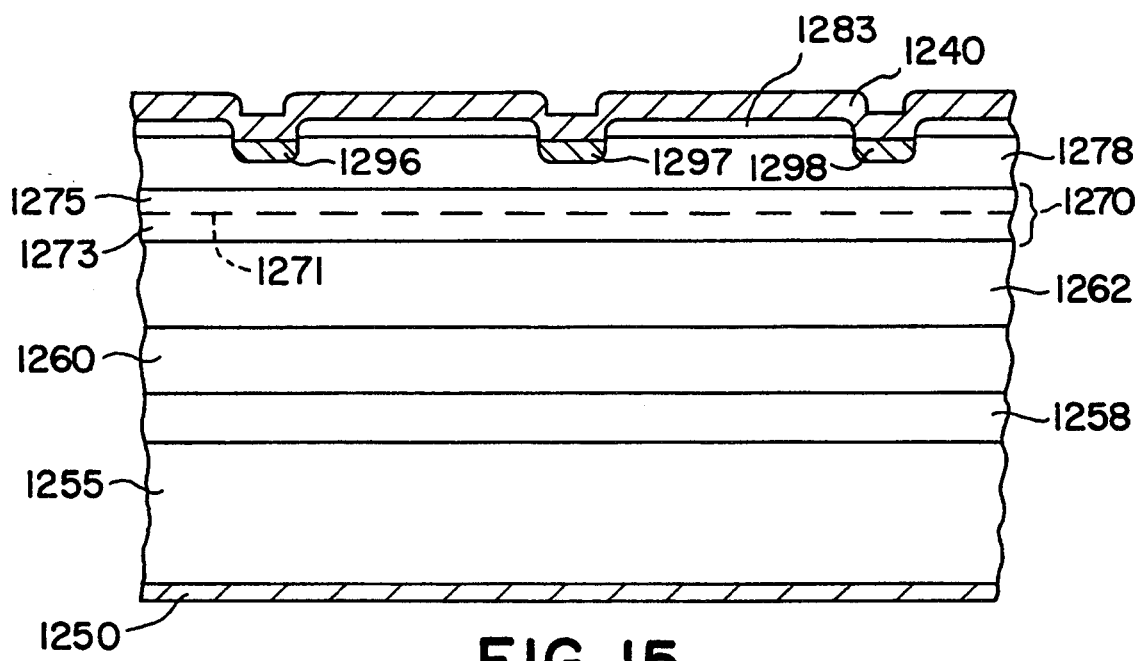
FIG. 15 is a cross-sectional diagram (not to scale), as taken through a section of the FIG. 12 device defined by arrows 15—15.

FIG. 12 shows a part of the surface of the device described in conjunction with FIGS. 9-11, and is used as a reference to show the cross-sections used for the illustrations of FIGS. 13-15. In FIG. 12 the stripe is labelled 1210 and the minicavities, or portions thereof, are labelled 1221-1225. The cross-section 13—13 is taken through the stripe 1210 and an adjacent minicavity 1224. The illustrated layers, which were previously described, include the bottom contact metallization 1250 (it being understood throughout that references to "bottom" or "top" are for ease of description, as the device may be mounted and used in any desired orientation), followed, in ascending order, by the n-type GaAs substrate layer 1255, the n-type GaAs buffer layer 1258, the n-type $Al_{0.23}Ga_{0.77}As$ buffer layer 1260, the n-type $Al_{0.5}Ga_{0.5}As$ lower confining layer 1263, and active region 1270 that includes a GaAs quantum well layer 1271 between waveguide layers 1273 and 1275 of undoped $Al_{0.23}Ga_{0.77}As$. Above the active region is the upper confining layer 1278 of p-type $Al_{0.8}Ga_{0.2}As$. The layer thicknesses may be, for example, as previously indicated above for the experimental device. The p-type GaAs contact 1281 and the p-type GaAs contact 1283 respectively define the contact positions of the stripe 1210 and the minicavity 1225 of FIG. 12. The native oxide is shown at 1291, 1292, and 1293, and, in this example, has a thickness of about 1300 Å The oxide also extends somewhat under the GaAs contact regions. The top (p-side) metallization is labeled 1240.

The diagram of FIG. 14 illustrates the cross-section defined by arrows 14-14 of FIG. 12. In this view, only the contact region 1281 of the stripe 1210 is visible. The oxide (1294) extends continuously to the right of the stripe.

FIG. 15 shows the cross-section defined by arrows 15-15 of FIG. 12. This view is longitudinally through the minicavities, with two minicavities being shown between three oxide regions 1296, 1297, 1298. The longitudinal dimension of the contact 1283 is seen in this view.

Figure 16:
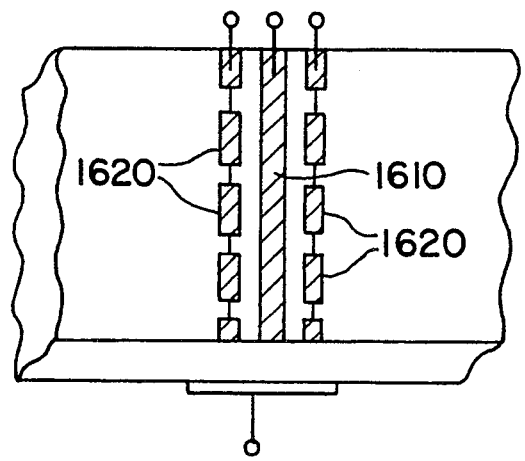
FIG. 16 illustrates a two-dimensional array that can be operated using two, three, or four terminals.
Figure 17:
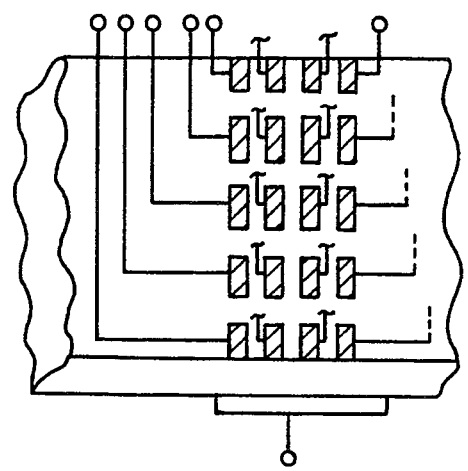
FIG. 17 illustrates a two-dimensional array with terminal control in both dimensions.

In the illustrated embodiments, operation may be "two terminal", such as by applying the electrical potential between the bottom electrode and the top common metallization. The device can alternatively be made for operation as a three terminal or multiple terminal device. For example, FIG. 16 illustrates a device having a stripe 1610 with mini cavities 1620 on both sides, each line having a common metallization (represented by the joining lines between minicavities) and its own terminal, so that the device can be operated with four independent terminals, with three terminals (for example, the terminals of only two adjacent lines and the bottom terminal, or with the two outside lines in common) or two terminals, with all three lines in common. [In this diagram, and in other diagrams hereof where a plan view of the minicavity and/or stripe configuration is shown, the underlying structure is of the type previously described, the fabrication masking patterns being consistent with the structures illustrated.] FIG. 17 illustrates a two-dimensional array of adjacent lines of mini cavities, with individual terminals coupled with the mini cavities. It will be understood that a terminal can be coupled with any desired combination or group of cavities or minicavities.

Figure 18:
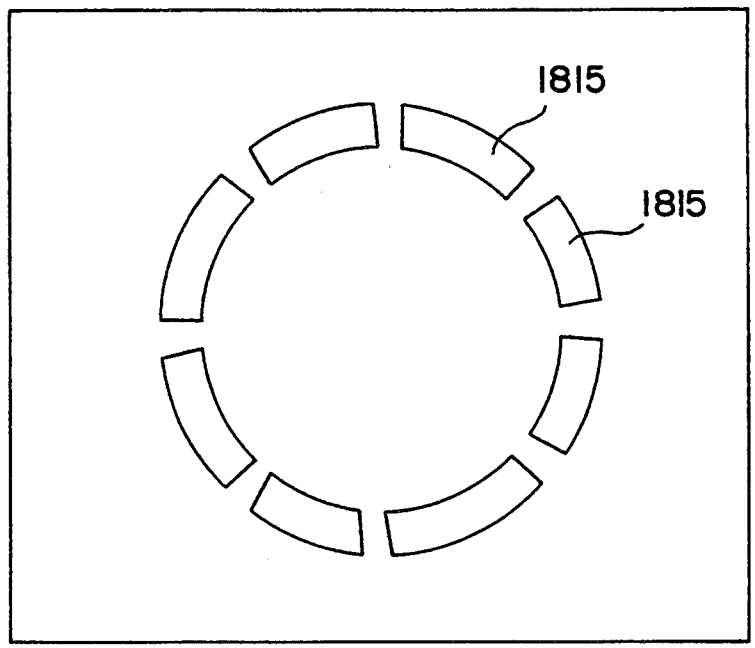
FIGS. 18–21 show plan views of ring lasers including minicavities in curved configurations in accordance with embodiments of the invention.
Figure 19:
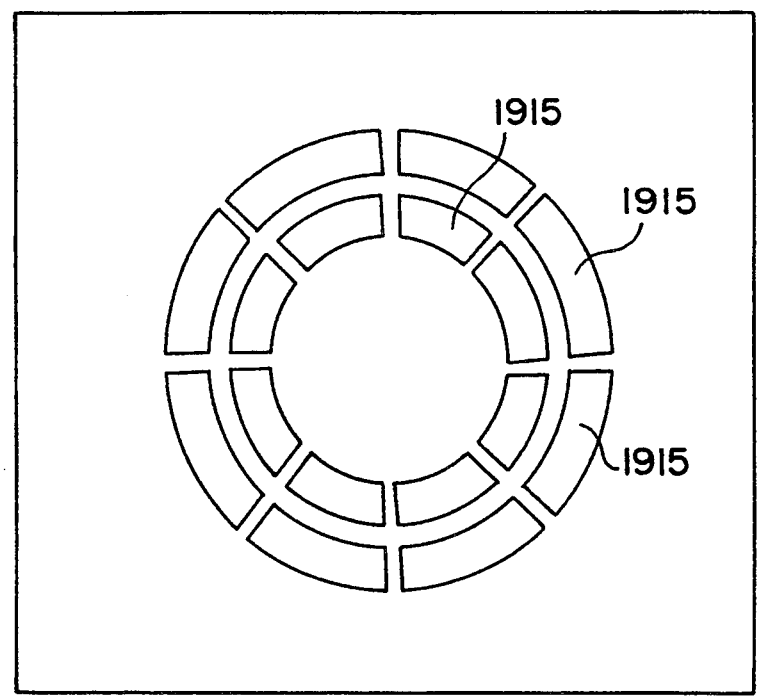
Figure 20:
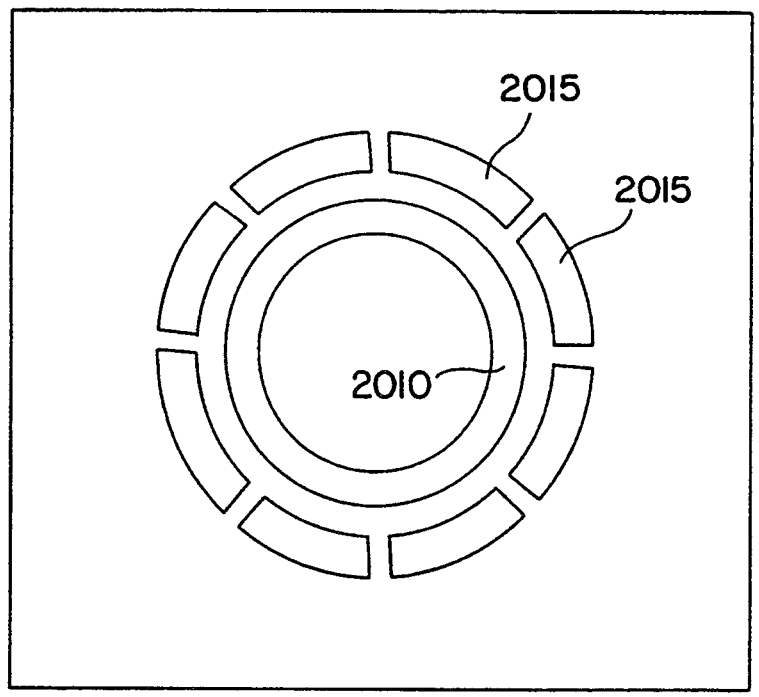
Figure 21:
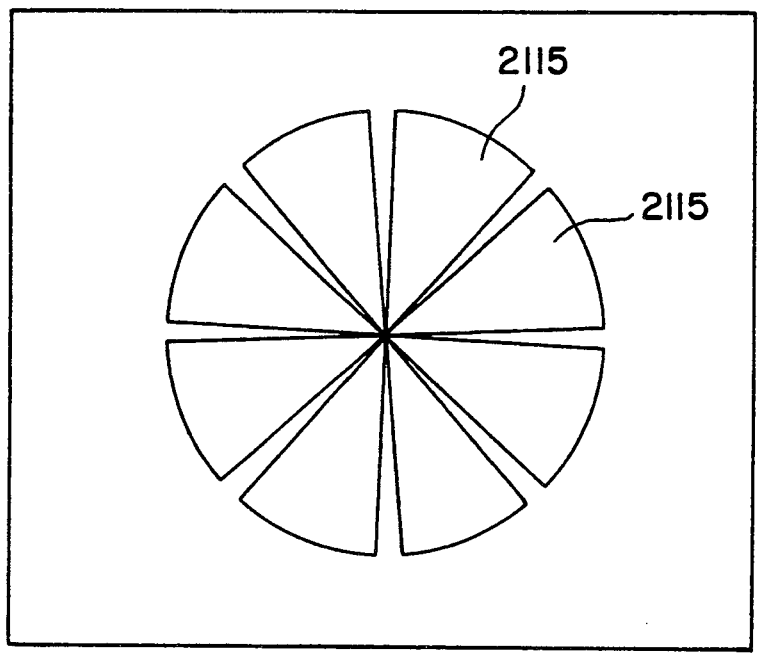

The previous embodiments illustrate straight line minicavity and stripe configurations, but it will be understood that the principles of the invention also apply to minicavities and stripes arranged in curved line configurations and arrays. FIGS. 18-25 illustrate some representative embodiments (with bottom electrode and various possible top electrodes not shown). In FIG. 18 there is shown a ring laser [see, for example, the above-referenced copending U.S. patent application Ser. No. 860,454, and Kish et al., Appl. Phys. Lett. 60, 13, (Mar. 30, 1992)], which is divided into curved minicavities 1815, to obtain the types of effects described in conjunction with FIGS. 1-4, in the context of a ring laser. [It will be understood throughout that any of the curved configurations need not be precisely circular, that any desired portions of rings or curves can be used, and that the rings or portions thereof can be cleaved at any desired position to obtain one or more outputs.] FIG. 19 illustrates two concentric ring lasers, each divided into minicavities 1915, so that lateral coupling can be achieved, as first described in conjunction with FIGS. 5-8 above for the case of straight line arrays. In FIG. 20, one of the concentric rings 2010 is continuous, and the other is divided into minicavities 2015, to obtain a curved version of the embodiment described in conjunction with FIGS. 9-15. FIG. 21 illustrates a circular configuration with sector-shaped minicavities 2115 separated by radial "spokes" of native oxide.

Figure 22:
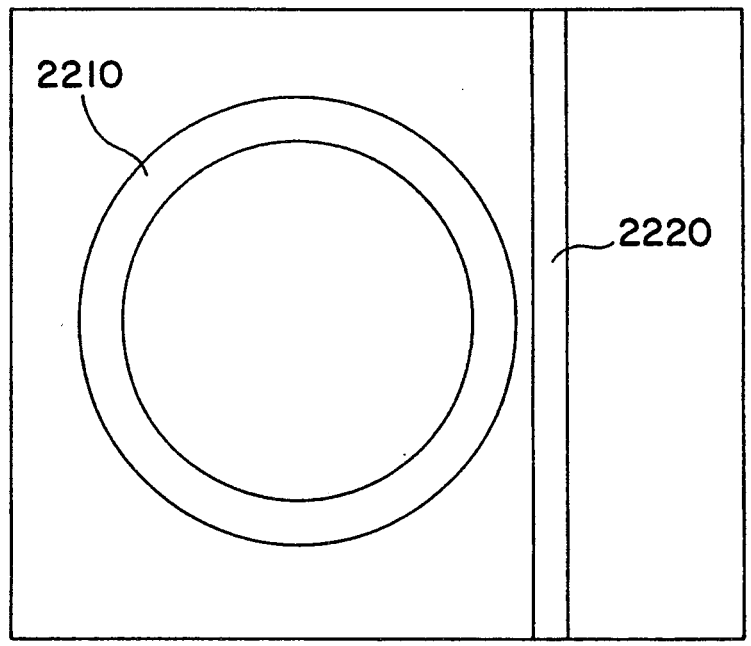
FIGS. 22–25 show plan views of adjacent ring and straight line lasers, with transverse coupling between laser cavities, and including configurations where the ring, the straight line, or both, are divided into minicavities.
Figure 23:
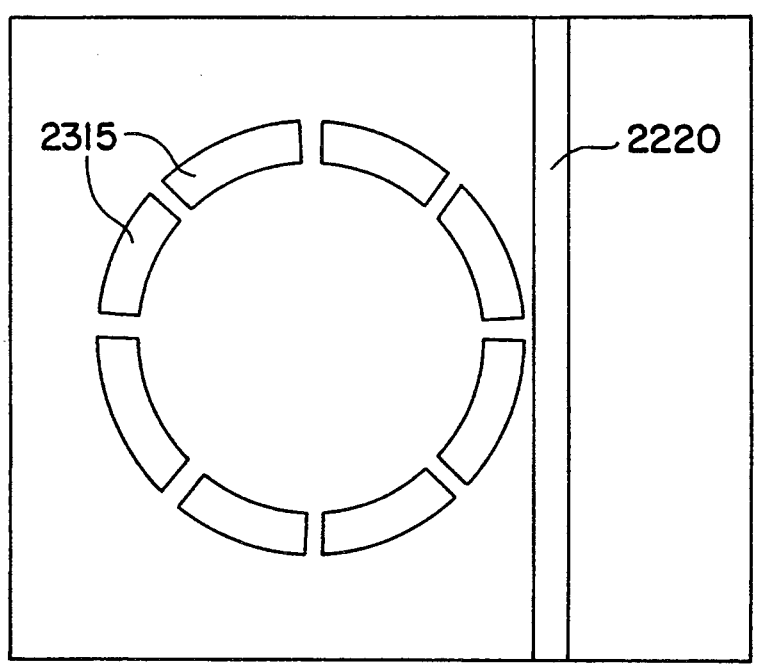
Figure 24:
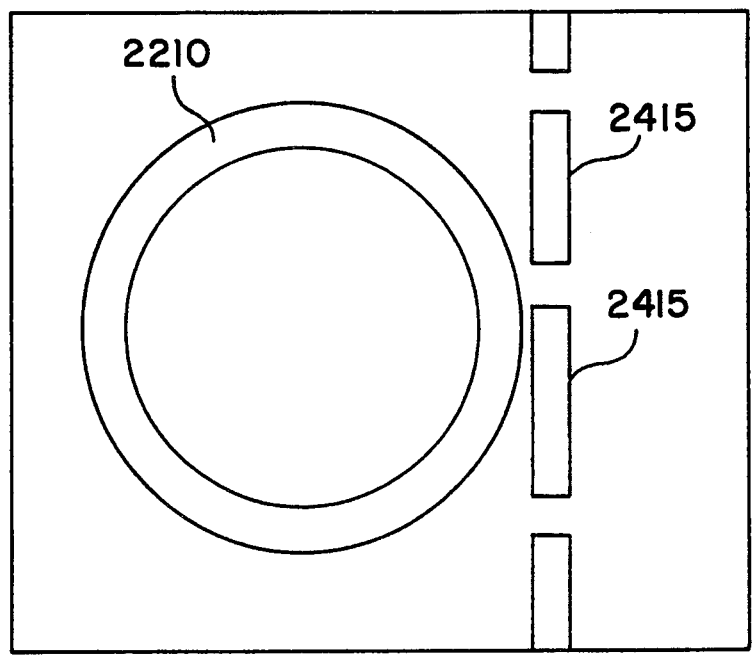
Figure 25:
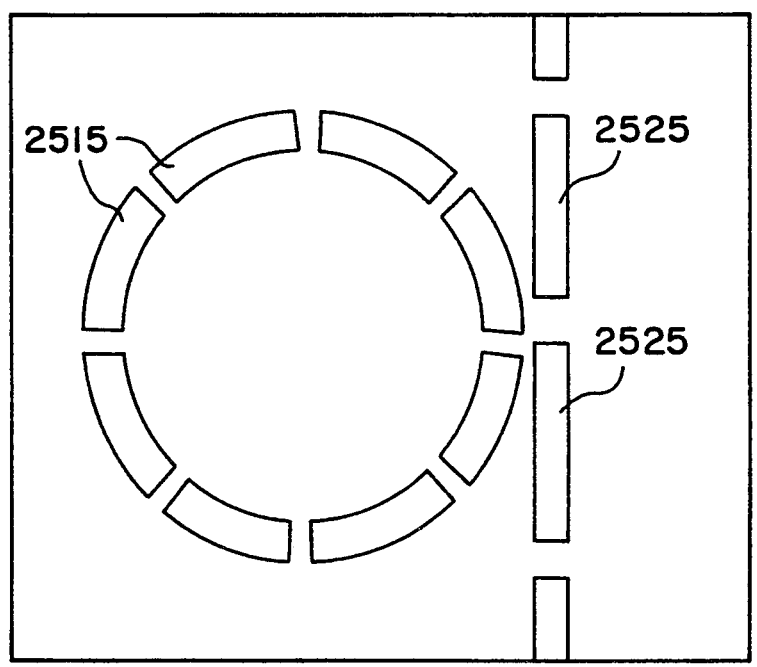

FIG. 22 shows a ring laser 2210 laterally coupled with a stripe laser 2220. In FIG. 23 the ring is divided into minicavities 2315, and in FIG. 24, the stripe is divided into minicavities 2415. In FIG. 25, both the ring and the stripe are divided into minicavities (2515 and 2525, respectively).

It will be understood that the previous indicated variations with regard to numbers and types of stripes, array elements, and/or terminal connections are applicable to embodiments with curved lines or minicavities.

Figure 26:
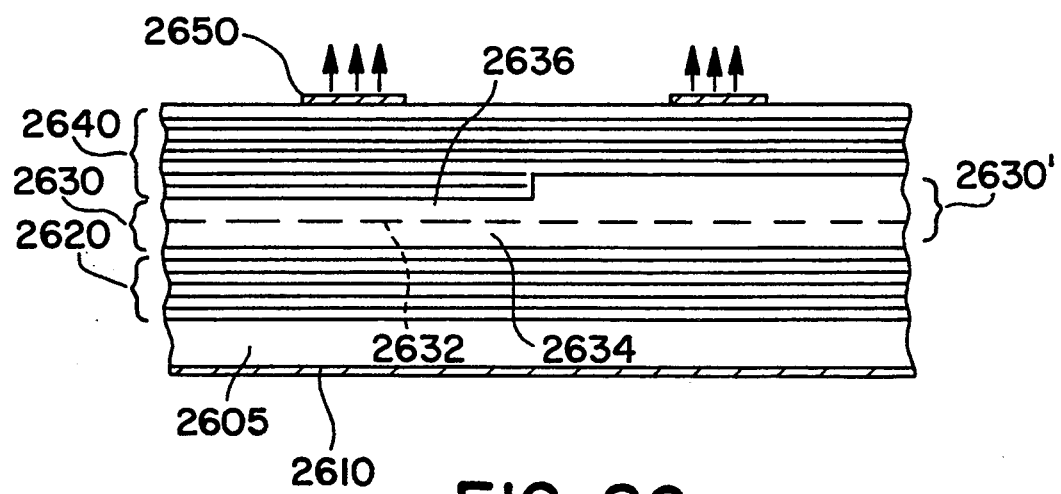
FIG. 26 is a cross-sectional diagram (not to scale) of a vertical cavity laser device with transverse coupling between adjacent laser cavities having different mode selection characteristics.

FIG. 26 illustrates, in cross-section, a form of the invention which couples cavities with different longitudinal mode characteristics, in the form of a vertical cavity laser array. Vertical cavity lasers are well known in the art (see, for example, H. Soda et al. Japan J. Appl. Phys. 18, 59 (1979) and K. Iga et al., Electron Lett. 23, 134 (1987), and include, as in the lefthand unit of FIG. 26, a bottom contact 2610 on a substrate (e.g. GaAs 2605), an n-type superlattice 2620, an active region 2630 that includes a quantum well layer 2632 between waveguide layers 2634 and 2636, a p-type superlattice 2640, and one or more contacts 2650. Various materials may be used. As one example, the superlattices may comprise a number of alternating layers of AlAs and GaAs [or $Al_xGa_{1-x}As$ and $Al_yGa_{1-y}As$, $x \neq y$, or combinations of $Al_xGa_{1-x}As$ and conductive dielectric stacks (e.g. $TiO_2/SiO_2$, $ZnSe/CaF_2$)], and the active region may comprise $Al_{0.1}Ga_{0.9}As$ (or GaAs) waveguides layers with a GaAs (or $In_{0.1}Ga_{0.9}As$) quantum well layer with total thickness of typically ~250 Å. The contacts at the surface may comprise for example Au or Ag with a standard (e.g. Ge-Au) backside (substrate) side contact. A two-dimensional vertical cavity coupled array of such devices is described for example in D. G. Deppe, J. P. Van der Ziel, Nasesh Chand, G. J. Zydzik, and S. N. G. Chu, Appl. Phys. Lett. 56, 2089 (1990). Briefly, in operation, the multiple reflections from the superlattice interfaces provide a relatively short effective cavity length (typically ~5 μm) from the limited thickness device, and the cavities are coupled evanescently.

In accordance with a feature of a form of the invention, adjacent vertical cavity laser units are provided with active regions of different thicknesses, as illustrated in FIG. 26, where the active region 2630' is substantially thicker than the active region thickness of its neighboring unit. In the illustration, the quantum well layer is continuous through adjacent active regions, although this is not necessary. The same is true of the superlattice layers above the active region 2630'. Variation of the upper or lower superlattice thickness laterally varies the effective lateral mirror reflectivity. Such variations may also be employed with a uniform thickness active region to achieve local variations in the cavity structure. In addition to the standard evanescent coupling, other schemes may be employed to couple such devices such as varying the mirror (e.g. superlattice) angles to directly reflect some of the light from one cavity into adjacent cavities.

There are various other techniques that can be utilized to obtain adjacent vertical cavities having substantially different effective vertical cavity lengths, so that lateral coupling thereof can be advantageously exploited to obtain properties such as switching, bistability, and/or tuning. [As used herein, vertical cavities having substantially different effective cavity lengths means that the cavities have substantially different longitudinal mode characteristics, as previously defined.] For example, the active regions of adjacent units may comprise different materials. Another alternative is to provide adjacent units with superlattices of different thicknesses, or superlattices of different configurations. An example of the latter would be to provide one unit having superlattices of alternating 100 Å GaAs and AlAs layers and the other unit with superlattices having alternating 200 Å GaAs layers and 100 Å AlAs layers, which results in different effective cavity lengths.

Figure 27:
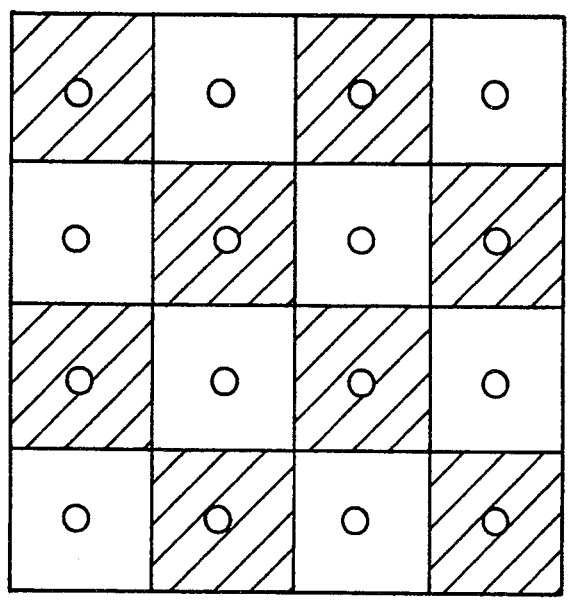
FIG. 27 illustrates a two-dimensional array of vertical cavity laser units of the type illustrated in FIG. 26.

FIG. 27 illustrates a checkerboard-type array of such units, with the cross-hatched units representing the units having the thicker active regions. The array can be operated as a two terminal device, with the top contacts coupled in common, and potential applied between the top and bottom contact, or can be driven as a three terminal or multiple terminal device with separate connections to contacts. Various other shapes and configurations in one-dimension or two-dimensions can be utilized. In one example of fabricating an array, the growth may be terminated at the active region (2630'). A two-dimensional pattern (e.g. a checkerboard) is then masked using standard photolithography techniques and the sample is subjected to chemical etching to remove a portion of the active region (2636) in the unmasked areas. This process results in a lateral variation in the active layer thickness. The photoresist is then removed and the upper p-type suppperlattice is grown on the patterned active region, such as by MOCVD or MBE (molecular beam epitaxy). A circular (dot) metallization can then be applied on the upper p-type supperlattice for contact and reflectivity purposes.

The invention has been described with reference to particular preferred embodiments, but variations within the spirit and scope of the invention will occur to those skilled in the art. For example, it will be understood that laterally coupled cavities as described herein can be utilized for tuning as well as indicated functions such as switching. Also, it will be understood that other III-V semiconductor material systems can be used, and that the indicated materials can be integrated with non-III-V materials. The lateral coupling described herein is particularly facilitated by using the native oxide formed in an aluminum-bearing III-V semiconductor material to separate laterally coupled cavities. In some of the configurations hereof, less preferred cavity definition can alternatively be implemented by techniques such as multiple regrowths/overgrowths, etch and regrowth/overgrowth, ridge formation, ridge formation and overgrowth, impurity induced layer disordering, and proton implantation.

We claim:

1. A semiconductor laser device, comprising:

a semiconductor active region disposed between first and second semiconductor confining layers;

an electrode array having electrode elements coupled with said first confining layer;

at least one opposing electrode coupled with said second confining layer;

the electrode elements of said array being spaced apart and forming a two-dimensional array that includes a plurality of electrode elements along a line and at least one further electrode element laterally spaced from the electrode elements of said line; and means for applying electrical signals between said electrode elements and said opposing electrode to effect light emission in active regions defined under said plurality of electrode elements and in at least one active region defined under said at least one further electrode element, and to effect lateral coupling of said emissions.

2. The device as defined by claim 1, wherein said at least one further electrode element comprises a single stripe which extends at least the length of said plurality of electrode elements.

3. The device as defined by claim 1, wherein at least one further electrode element comprises a further plurality of electrode elements.

4. The device as defined by claim 2, wherein said stripe is parallel to said line.

5. The device as defined by claim 3, wherein said further plurality of electrode elements are along a further line parallel to said first mentioned line.

6. The device as defined by claim 1, wherein said plurality of electrode elements comprises several electrode elements.

7. The device as defined by claim 2, wherein said plurality of electrode elements comprises several electrode elements.

8. The device as defined by claim 3, wherein said plurality of electrode elements comprises several electrode elements, and said at least one further electrode element comprises several further electrode elements.

9. The device as defined by claim 1, wherein said electrode elements along said line define laser mini-cavities that are end-coupled with each other.

10. The device as defined by claim 6, wherein said electrode elements along said line define laser mini-cavities that are end-coupled with each other.

11. The device as defined by claim 5, wherein said electrode elements along said line define laser mini-cavities that are end-coupled with each other, and said further electrode elements along said further line define laser mini-cavities that are end-coupled with each other.

12. The device as defined by claim 6, wherein said array includes at least one additional electrode element laterally spaced from the electrode elements of said line and said at least one further electrode element.

13. The device as defined by claim 1, wherein said two-dimensional array comprises several rows and several columns of electrode elements.

14. The device as defined by claim 13, wherein the electrode elements of at least a plurality of said columns define laser mini-cavities that are end-coupled with each other, and wherein at least a plurality of adjacent pairs of laser minicavities are laterally coupled with each other.

15. The device as defined by claim 1, wherein said first confining layer is an aluminum-bearing III-V semiconductor material, and wherein at least one lateral confining region of a native oxide of said aluminum-bearing material is disposed in said confining layer between said plurality of electrode elements and said at least one further electrode element, and wherein end confining regions of a native oxide of said aluminum-bearing material are disposed between said plurality of electrode elements along said line.

16. The device as defined by claim 2, wherein said first confining layer is an aluminum-bearing III-V semiconductor material, and wherein at least one lateral confining region of a native oxide of said aluminum-bearing material is disposed in said confining layer between said plurality of electrode elements and said at least one further electrode element, and wherein end confining regions of a native oxide of said aluminum-bearing material are disposed between said plurality of electrode elements along said line.

17. The device as defined by claim 3, wherein said first confining layer is an aluminum-bearing III-V semiconductor material, and wherein at least one lateral confining region of a native oxide of said aluminum-bearing material is disposed in said confining layer between said plurality of electrode elements and said at least one further electrode element, and wherein end confining regions of a native oxide of said aluminum-bearing material are disposed between said plurality of electrode elements along said line.

18. The device as defined by claim 17, wherein end confining regions of a native oxide of said aluminum-bearing material are disposed between said further plurality of electrode elements.

19. A semiconductor laser device, comprising:
a semiconductor active region disposed between first and second semiconductor confining layers, said first and second semiconductor confining layers being of opposite conductivity type, and said first semiconductor confining layer being an aluminum-bearing III-V semiconductor material;
an oxide of said aluminum-bearing III-V semiconductor material formed in at least a portion of said first confining layer, said oxide substantially surrounding a plurality of regions of said aluminum-bearing semiconductor material of said first confining layer, said surrounded regions being arranged in serial sequence along a line;
a plurality of electrode elements coupled with respective surrounded regions of said first confining layer; and
at least one opposing electrode element coupled with said second confining layer.

20. The device as defined by claim 19, wherein said oxide substantially surrounds at least one further region of said aluminum-bearing semiconductor material of said first confining layer, said at least one further region being laterally spaced from and adjacent to the line of said plurality of regions, and at least one further electrode element coupled with the at least one further surrounded region of said first confining layer.

21. The device as defined by claim 20, wherein said at least one further region comprises a single elongated region adjacent to the line of said plurality of regions.

22. The device as defined by claim 20, wherein said at least one further region comprises a plurality of further regions arranged in serial sequence and adjacent to the line of said plurality of regions.

23. The device as defined by claim 19, wherein said plurality of regions comprises several regions.

24. The device as defined by claim 20, wherein said plurality of regions comprises several regions.

25. The device as defined by claim 19, wherein said electrode elements include semiconductor contacts coupled to said surrounded regions.

26. The device as defined by claim 20, wherein said electrode elements include semiconductor contacts coupled to said surrounded regions, and said at least one further surrounded region.

27. The device as defined by claim 25, further comprising means for applying electrical signals between said opposing electrode and said plurality of electrode elements.

28. The device as defined by claim 26, further comprising means for applying electrical signals between said opposing electrode and said plurality of electrode elements and said at least one further electrode element.

29. The device as defined by claim 27, wherein said means for applying electrical signals includes independent terminal connections to at least some of said plurality of electrode elements.

30. The device as defined by claim 28, wherein said means for applying electrical signals includes independent terminal connections to at least some of said plurality of electrode elements and further plurality of electrode elements.

31. The device as defined by claim 19, wherein said line is a straight line.

32. The device as defined by claim 20, wherein said line is a straight line.

33. The device as defined by claim 19, wherein said line is a curved line.

34. The device as defined by claim 20, wherein said line is a curved line.

* * * * *